United States Patent
Thomas et al.

(10) Patent No.: US 11,681,167 B2
(45) Date of Patent: Jun. 20, 2023

(54) OPTOELECTRONIC DEVICE AND ARRAY THEREOF

(71) Applicant: ROCKLEY PHOTONICS LIMITED, Altrincham (GB)

(72) Inventors: Abu Thomas, Oak Park, CA (US); Albert Benzoni, South Pasadena, CA (US); Jacob Levy, Sierra Madre, CA (US); Thomas Pierre Schrans, Temple City, CA (US); Andrea Trita, Pasadena, CA (US); Guomin Yu, Glendora, CA (US); Aaron John Zilkie, Pasadena, CA (US)

(73) Assignee: Rockley Photonics Limited, Altrincham (GB)

( * ) Notice: Subject to any disclaimer, the term of this patent is extended or adjusted under 35 U.S.C. 154(b) by 0 days.

(21) Appl. No.: 17/349,835

(22) Filed: Jun. 16, 2021

(65) Prior Publication Data
US 2021/0311333 A1    Oct. 7, 2021

Related U.S. Application Data

(63) Continuation-in-part of application No. 17/199,352, filed on Mar. 11, 2021, now abandoned, which is a
(Continued)

(30) Foreign Application Priority Data

Apr. 6, 2018   (GB) ...................... 1805782

(51) Int. Cl.
*G02F 1/01*     (2006.01)
*G02F 1/017*    (2006.01)
(Continued)

(52) U.S. Cl.
CPC ..... *G02F 1/01708* (2013.01); *G02B 6/12004* (2013.01); *G02F 1/025* (2013.01);
(Continued)

(58) Field of Classification Search
CPC .... G02F 1/01708; G02F 1/025; G02F 1/0157; G02F 2202/102; G02F 2203/70;
(Continued)

(56) References Cited

U.S. PATENT DOCUMENTS 4,025,939 A   5/1977   Aiki et al.
4,786,131 A   11/1988  Mahapatra et al.
(Continued)

FOREIGN PATENT DOCUMENTS

CN    104781708 A    7/2015
CN    104901159 B    1/2018
(Continued)

OTHER PUBLICATIONS

Baets, R. et al., "Loss calculation and design of arbitrarily curved integrated-optic waveguides", Optical Society of America, Feb. 1983, pp. 177-182, vol. 73, No. 2.
(Continued)

*Primary Examiner* — Jerry M Blevins
(74) *Attorney, Agent, or Firm* — Lewis Roca Rothgerber Christie LLP

(57) ABSTRACT

A photonic chip. In some embodiments, the photonic chip includes a waveguide; and an optically active device comprising a portion of the waveguide. The waveguide may have a first end at a first edge of the photonic chip; and a second end, and the waveguide may have, everywhere between the first end and the second end, a rate of change of curvature having a magnitude not exceeding 2,000/mm².

20 Claims, 16 Drawing Sheets

Related U.S. Application Data continuation of application No. 17/098,290, filed on Nov. 13, 2020, now abandoned, which is a continuation of application No. 16/985,008, filed on Aug. 4, 2020, now abandoned, which is a continuation of application No. 16/375,797, filed on Apr. 4, 2019, now abandoned.

(51) Int. Cl.

| | | |
|---|---|---|
| *H01S 5/00* | (2006.01) | |
| *H01S 5/026* | (2006.01) | |
| *H01S 5/10* | (2021.01) | |
| *G02F 1/025* | (2006.01) | |
| *G02B 6/12* | (2006.01) | |
| *H01S 5/343* | (2006.01) | |
| *H01S 5/12* | (2021.01) | |
| *H01S 5/50* | (2006.01) | |
| *H01S 5/227* | (2006.01) | |
| *G02F 1/015* | (2006.01) | |

(52) U.S. Cl.
CPC ............ *H01S 5/0085* (2013.01); *H01S 5/026* (2013.01); *H01S 5/0265* (2013.01); *H01S 5/101* (2013.01); *G02F 1/0157* (2021.01); *G02F 2202/102* (2013.01); *G02F 2203/70* (2013.01); *H01S 5/12* (2013.01); *H01S 5/227* (2013.01); *H01S 5/34306* (2013.01); *H01S 5/50* (2013.01)

(58) Field of Classification Search
CPC ...... H01S 5/0085; H01S 5/026; H01S 5/0265; H01S 5/101; H01S 5/12; H01S 5/227; H01S 5/34306; H01S 5/50
USPC ............................................................ 385/2
See application file for complete search history.

(56) References Cited

U.S. PATENT DOCUMENTS

| | | | |
|---|---|---|---|
| 5,212,758 A | 5/1993 | Adar et al. | |
| 5,838,844 A | 11/1998 | Van Dam et al. | |
| 6,212,323 B1 | 4/2001 | Harpin et al. | |
| 6,516,120 B2 | 2/2003 | Roberts et al. | |
| 6,719,884 B2 | 4/2004 | Marsh et al. | |
| 7,599,596 B1* | 10/2009 | Feng ..................... | G02B 6/122 398/139 |
| 8,045,834 B2 | 10/2011 | Painter et al. | |
| 8,094,987 B2 | 1/2012 | Martin Armani | |
| 8,620,120 B2 | 12/2013 | Baets et al. | |
| 9,075,251 B2 | 7/2015 | Dwivedi et al. | |
| 9,606,293 B2 | 3/2017 | Ma | |
| 9,690,045 B2 | 6/2017 | Goodwill et al. | |
| 9,696,478 B2 | 7/2017 | Bogaerts | |
| 9,778,417 B2 | 10/2017 | Cherchi et al. | |
| 10,838,146 B2 | 11/2020 | Trita | |
| 2003/0043448 A1 | 3/2003 | Bond et al. | |
| 2004/0234223 A1 | 11/2004 | Logvin et al. | |
| 2005/0013332 A1 | 1/2005 | Kish, Jr. et al. | |
| 2007/0153868 A1 | 7/2007 | West et al. | |
| 2009/0285542 A1 | 11/2009 | Martin Armani et al. | |
| 2010/0021171 A1 | 1/2010 | Wang et al. | |
| 2011/0116735 A1 | 5/2011 | Baets et al. | |
| 2011/0138860 A1 | 6/2011 | Martin Armani | |
| 2013/0016744 A1 | 1/2013 | Li et al. | |
| 2014/0161384 A1 | 6/2014 | Dwivedi et al. | |
| 2014/0204352 A1 | 7/2014 | Mochizuki et al. | |
| 2015/0260916 A1 | 9/2015 | Cherchi et al. | |
| 2015/0277042 A1 | 10/2015 | Goodwill et al. | |
| 2016/0025931 A1 | 1/2016 | Bogaerts | |
| 2016/0136899 A1* | 5/2016 | Koranne ............... | G06F 17/175 700/98 |
| 2017/0071510 A1 | 3/2017 | Delbeke et al. | |
| 2017/0163000 A1* | 6/2017 | Evans ..................... | H01S 5/142 |
| 2017/0192173 A1 | 7/2017 | Evans | |
| 2017/0194309 A1 | 7/2017 | Evans et al. | |
| 2017/0205578 A1 | 7/2017 | Van Thourhout et al. | |
| 2017/0299902 A1 | 10/2017 | Yu et al. | |
| 2019/0013640 A1* | 1/2019 | Cheung ................. | H01S 5/4062 |
| 2019/0310496 A1 | 10/2019 | Zilkie et al. | |
| 2020/0363663 A1 | 11/2020 | Zilkie et al. | |
| 2021/0080761 A1 | 3/2021 | Zilkie et al. | |

FOREIGN PATENT DOCUMENTS

| | | |
|---|---|---|
| EP | 0 645 649 A2 | 3/1995 |
| EP | 1 464 997 A1 | 10/2004 |
| GB | 2 378 260 A | 2/2003 |
| GB | 2572641 A | 10/2019 |
| JP | 06-313821 A | 11/1994 |
| JP | 11-64654 A | 3/1999 |
| JP | 2006-78570 A | 3/2006 |
| JP | 2006-091679 A | 4/2006 |
| JP | 2011-155103 A | 8/2011 |
| JP | 2012-173551 A | 9/2012 |
| WO | WO 02/14915 A2 | 2/2002 |
| WO | WO 02/14918 A1 | 2/2002 |
| WO | WO 03/048826 A2 | 6/2003 |
| WO | WO 2014/060648 A1 | 4/2014 |
| WO | WO 2018/146221 A1 | 8/2018 |
| WO | WO 2019/193111 A1 | 10/2019 |

OTHER PUBLICATIONS

Bauters, J. F. et al., "Ultra-low-loss high-aspect-ratio $Si_3N_4$ waveguides", Optics Express, Feb. 3, 2011, pp. 3163-3174, vol. 19, No. 4, Optical Society of America.

Berlatzky, Y. et al., "Controlling Coupling of Guided to Radiating Modes Using Adiabatic Transitions Between Waveguides of Different Curvature", Journal of Lightwave Technology, Mar. 2005, pp. 1278-1283, vol. 23, No. 3, IEEE.

Bogaerts, W. et al., "Compact Single-Mode Silicon Hybrid Rib/Strip Waveguide With Adiabatic Bends", IEEE Photonics Journal, Jun. 2011, 13 pages, vol. 3, No. 3, IEEE.

Charles, N. et al., "Design of Optically Path Length Matched, Three-Dimensional Photonic Circuits Comprising Uniquely Routed Waveguides", Appl. Opt., 2012, pp. 1-11.

Charles, N. et al., "Techniques for Designing Physically Path-Length Matched Optical Circuitry", IQEC/CLEO Pacific Rim 2011, Aug. 28, 2011 through Sep. 1, 2011, Sydney, Australia, pp. 73-75, AOS.

Cherchi, M. et al., "Dramatic size reduction of waveguide bends on a micron-scale silicon photonic platform", Optics Express, Jul. 29, 2013, pp. 17814-17823, vol. 21, No. 15, Optical Society of America.

Chinese Notification of the First Office Action, for Patent Application No. CN201780034439.8, dated Apr. 26, 2020, 10 pages.

Feng, D. et al., "Compact single-chip VMUX/DEMUX on the silicon-on-insulator platform", Optics Express, Mar. 28, 2011, pp. 6125-6130, vol. 19, No. 7, Optical Society of America.

International Search Report and Written Opinion of the International Searching Authority, dated Oct. 16, 2017, Corresponding to PCT/GB2017/051470, 25 pages.

Invitation to Pay Additional Fees and Partial Search Report dated Aug. 21, 2017, Corresponding to International Application No. PCT/GB2017/051470; 17 pages.

Ismail, N. et al., "Improved arrayed-waveguide-grating layout avoiding systematic phase errors", Optics Express, Apr. 20, 2011, pp. 8781-8794, vol. 19, No. 9, Optical Society of America.

Kim, W.-C. et al., "Investigation of 18-channel CWDM arrayed waveguide grating with silica-based waveguide", Optical Engineering, Aug. 24, 2016, pp. 087110-1 through 087110-6, vol. 55, No. 8, SPIE.

Koos, C. et al., "Ideal Bend Contour Trajectories for Single-Mode Operation of Low-Loss Overmoded Waveguides", IEEE Photonics Technology Letters, Jun. 1, 2007, vol. 19, No. 11, pp. 819-821, IEEE.

(56) References Cited

OTHER PUBLICATIONS

Muneeb, M. et al., "Silicon-on-insulator shortwave infrared wavelength meter with integrated photodiodes for on-chip laser monitoring", Optics Express, Oct. 27, 2014, pp. 27300-27308, vol. 22, No. 22, Optical Society of America.
Mustieles, F. J. et al., "Theoretical S-Bend Profile for Optimization of Optical Waveguide Radiation Losses", IEEE Photonics Technology Letters, May 1993, pp. 551-553, vol. 5, No. 5, IEEE.
O'Brien, J. F., "CS 294-13 Advanced Computer Graphics Subdivision Basics", University of California, Natural Splines, Nov. 12, 2009, 34 pages, available at: https://inst.eecs.berkeley.edu/~cs294-13/fa09/lectures/294-lecture17.pdf.
Okamoto, K., "Wavelength-Division-Multiplexing Devices in Thin SOI: Advances and Prospects", IEEE Journal of Selected Topics in Quantum Electronics, Jan. 10, 2014, 10 pages, vol. 20, No. 4, IEEE.
Partial English translation of Chinese Notification of the First Office Action, for Patent Application No. CN201780034439.8, dated Apr. 26, 2020, 8 pages.
Pathak, S. et al., "Comparison of AWGs and Echelle Gratings for Wavelength Division Multiplexing on Silicon-on-Insulator", IEEE Photonics Journal, Oct. 15, 2014, 10 pages, vol. 6, No. 5, IEEE.
Pathak, S., "Silicon Nano-Photonics Based Arrayed Waveguide Gratings", IMEC, Mar. 2014, 75 pages.
Pathak, S., "Silicon Nano-Photonics Based Arrayed Waveguide Gratings", University of Gwent, Jan. 2014, 234 pages.
Rickman, A., "The commercialization of silicon photonics", Nature Photonics, Aug. 2014, pp. 579-582, vol. 8, Macmillan Publishers Limited.
Sheehan, R. N. et al., "The design of low-loss curved waveguides", Optical and Quantum Electronics, Aug. 21, 2009, pp. 1211-1218, vol. 40, Springer Science+Business Media, LLC.
Sheng, K. J., "Design, Fabrication and Experimental Characterization of a PDMS-Based AWG Spectrometer", Thesis submitted to the Nanyang Technological University in fulfillment of the requirement for the degree of Doctor of Philosophy, 2011, 183 pages.
Soref, R. A. et al., "Large Single-Mode Rib Waveguides in GeSi-Si and Si-on-$SiO_2$", IEEE Journal of Quantum Electronics, Aug. 1991, pp. 1971-1974, vol. 27, No. 8, IEEE.
Takahashi, H. et al., "Wavelength Multiplexer Based on $SiO_2$-$Ta_2O_5$ Arrayed-Waveguide Grating", Journal of Lightwave Technology, pp. 989-995, Jun. 1994, vol. 12, No. 6, IEEE.
Trita, A. et al., "Miniaturized Fiber Bragg Grating Interrogator based on an Arrayed Waveguide Grating in SOI platform", Frontiers in Optics/Laser Science, paper FTh3E.6, 2015, 2 pages, Optical Society of America.
Tu, X. et al., "Compact low-loss adiabatic bends in silicon shallow-etched waveguides", 2016 IEEE $13^{th}$ International Conference on Group IV Photonics (GFP), Shanghai, 2016, pp. 48-49, IEEE.
U.K. Intellectual Property Office Examination Report, dated Aug. 30, 2018, for Patent Application No. GB1812302.6, 2 pages.
U.K. Intellectual Property Office Examination Report, dated Aug. 13, 2020, for Patent Application No. GB 1812302.6, 2 pages.
U.K. Intellectual Property Office Examination Report, dated Feb. 15, 2019, for Patent Application No. GB1812302.6, 7 pages.
U.K. Intellectual Property Office Examination Report, dated Feb. 12, 2020, for Patent Application No. GB1812302.6, 4 pages.
U.S. Advisory Action from U.S. Appl. No. 15/489,669, dated Dec. 16, 2019, 10 pages.
U.S. Examiner Interview Summary from U.S. Appl. No. 15/489,669, dated May 24, 2018, 4 pages.
U.S. Corrected to Notice of References Cited from U.S. Appl. No. 15/489,669, dated Oct. 22, 2020, 3 pages.
U.S. Office Action from U.S. Appl. No. 15/489,669, dated Jan. 11, 2018, 14 pages.
U.S. Office Action from U.S. Appl. No. 15/489,669, dated Aug. 7, 2018, 16 pages.
U.S. Office Action from U.S. Appl. No. 15/489,669, dated Jan. 7, 2019, 18 pages.
U.S. Office Action from U.S. Appl. No. 15/489,669, dated Jul. 26, 2019, 19 pages.
U.S. Office Action from U.S. Appl. No. 15/489,669, dated Oct. 6, 2017, 7 pages.
Watts, M. R., "Adiabatic microring resonators", Optics Letters, Oct. 1, 2010, pp. 3231-3233, vol. 35, No. 19, Optical Society of America.
Zhou, X. et al., "Application of Physical Spline Finite Element Method (PSFEM) to Fullwave Analysis of Waveguides", Progress in Electromagnetics Research, 2006, pp. 19-41, vol. 60, Arizona State University, available at: http://www.jpier.org/PIER/pier.php?paper=0508112.
Daunt, Christopher, "The Optimisation of Electro-Absorption Modulators for Photonic Integrated Circuits", Thesis submitted for the degree of Doctor of Philosophy, Jun. 2012, 194 pages, National University of Ireland, Cork.
International Search Report and Written Opinion of the International Searching Authority, dated Jul. 22, 2019, Corresponding to PCT/EP2019/058543, 16 pages.
U.K. Intellectual Property Office Search and Examination Report, dated Sep. 5, 2018, for Patent Application No. GB1805782.8, 8 pages.
U.K. Intellectual Property Office Examination Report, dated May 1, 2020, for Patent Application No. GB1805782.8, 5 pages.
U.K. Intellectual Property Office Examination Report, dated Sep. 25, 2020, for Patent Application No. GB1805782.8, 7 pages.
Unpublished U.S. Appl. No. 17/199,352, filed Mar. 11, 2021.
U.S. Office Action from U.S. Appl. No. 16/375,797, dated Mar. 5, 2020, 10 pages.
International Search Report and Written Opinion of the International Searching Authority, corresponding to PCT/EP2022/066521, dated Oct. 17, 2022, 15 pages.

\* cited by examiner

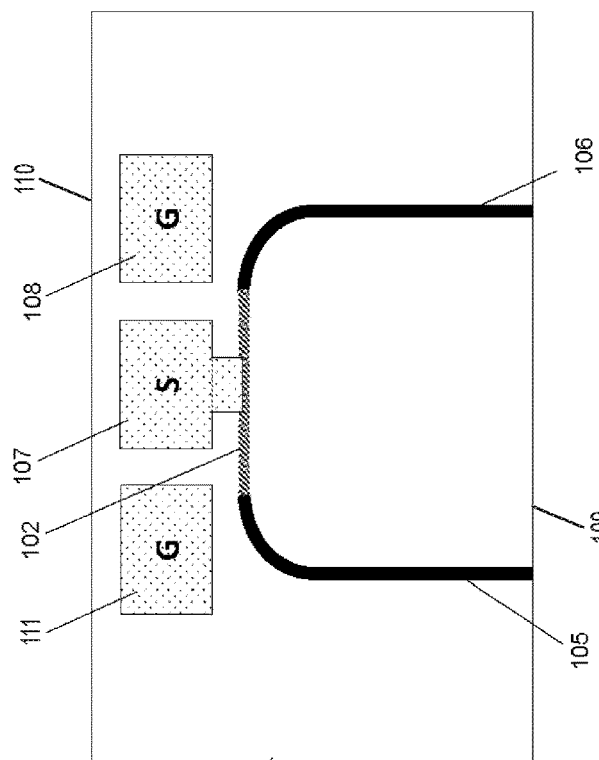
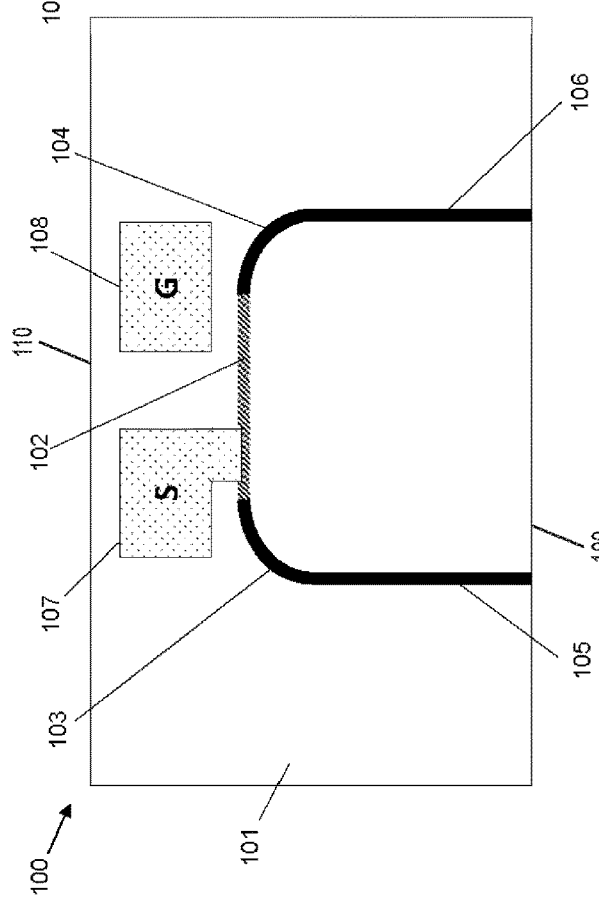

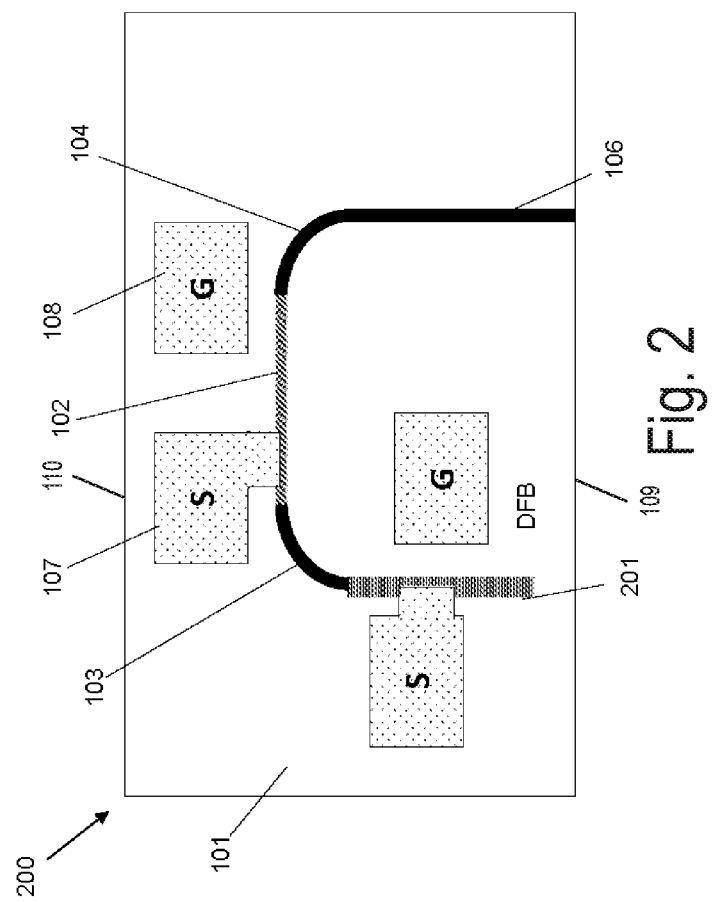

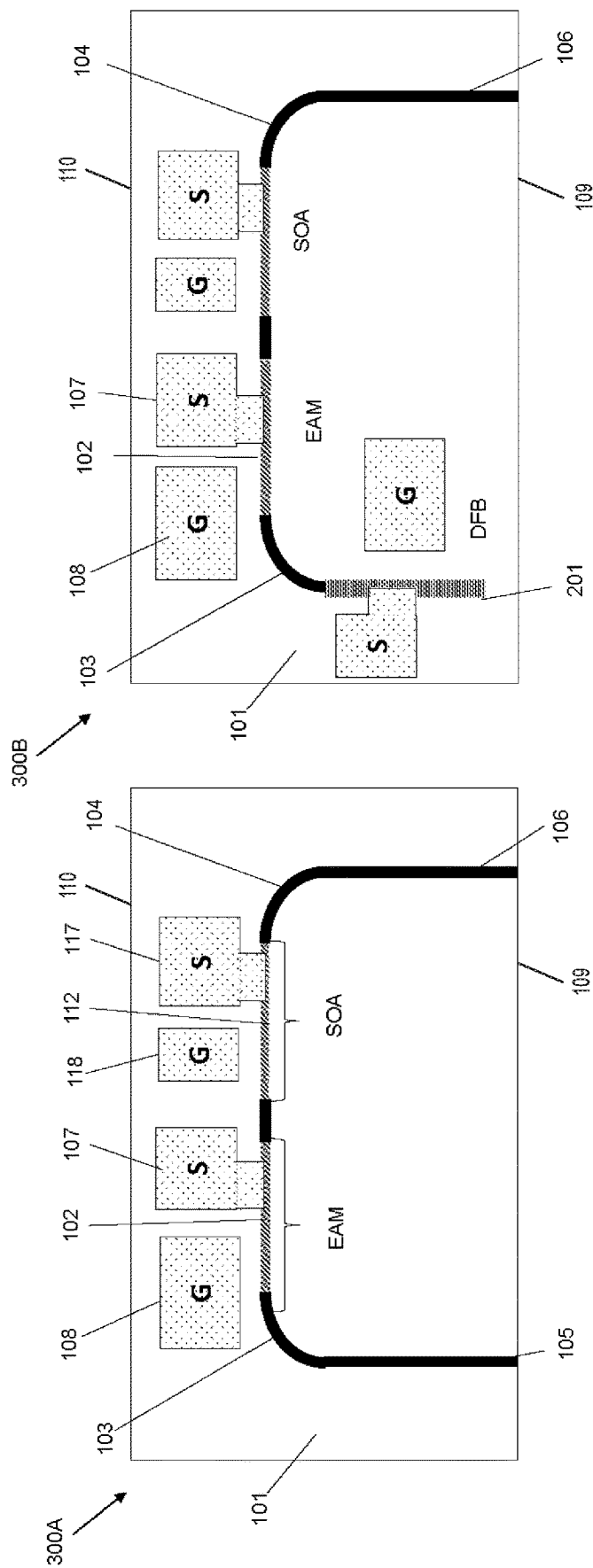

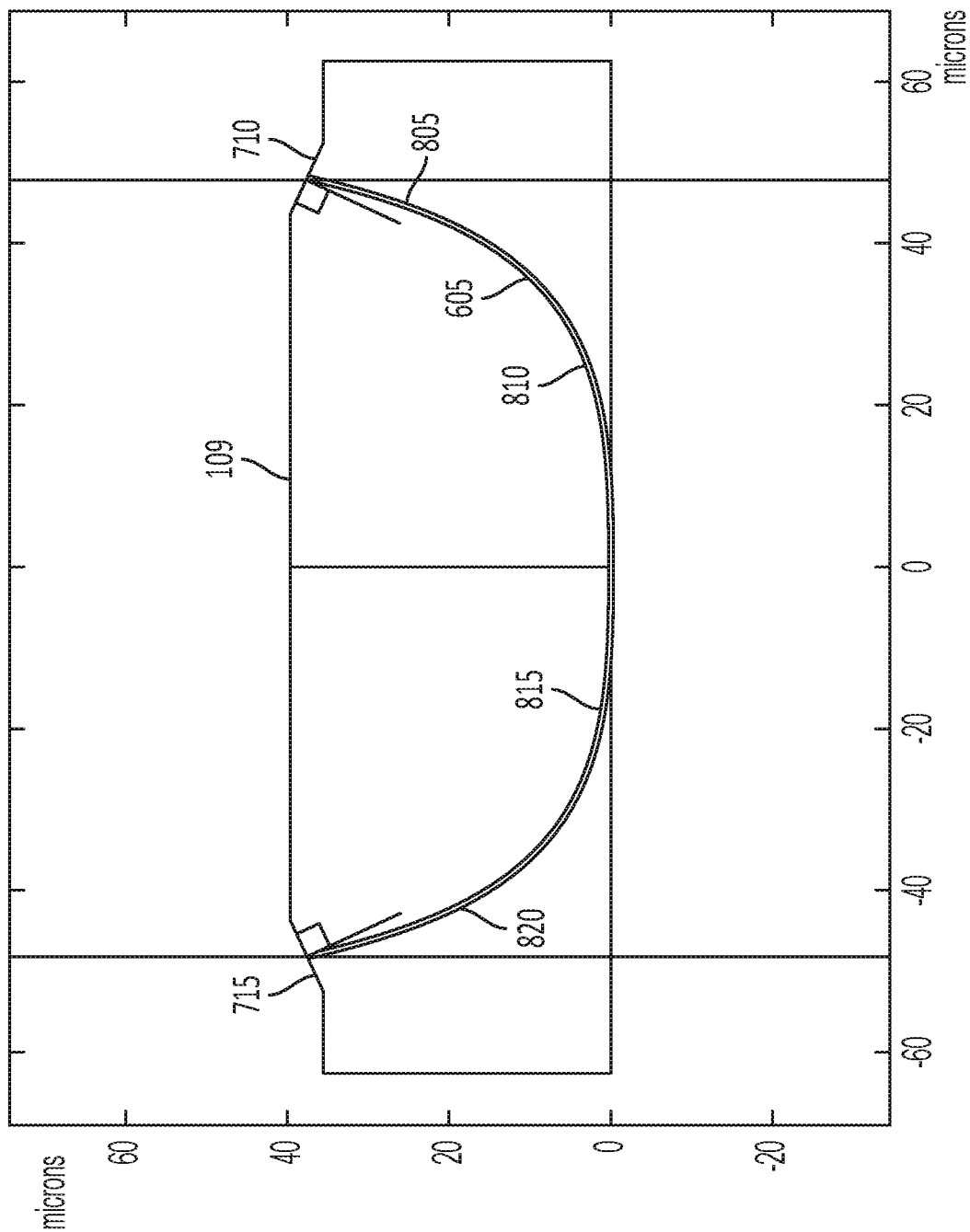

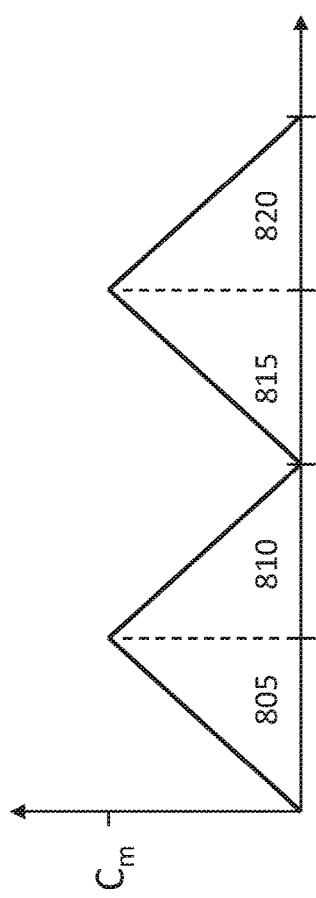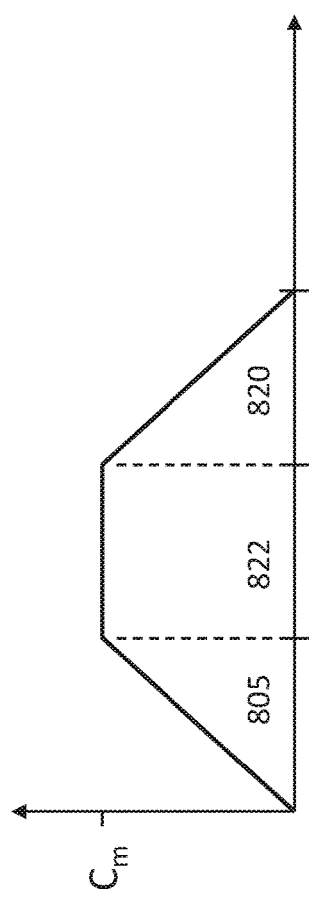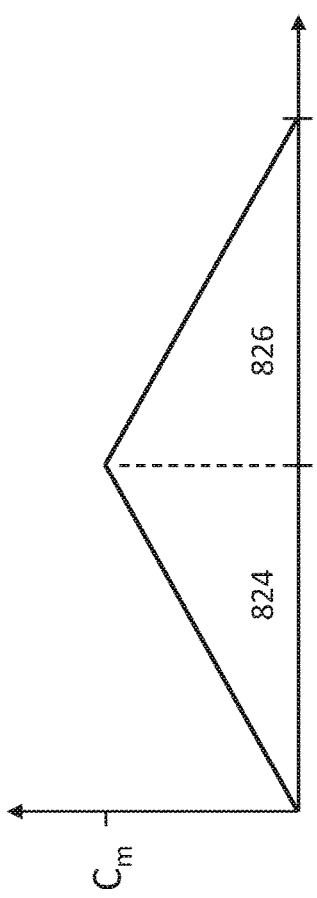

OPTOELECTRONIC DEVICE AND ARRAY THEREOF

CROSS-REFERENCE TO RELATED APPLICATION(S)

The present application is a continuation-in-part of U.S. patent application Ser. No. 17/199,352, filed Mar. 11, 2021, entitled "OPTOELECTRONIC DEVICE AND ARRAY THEREOF", which is a continuation of U.S. patent application Ser. No. 17/098,290, filed Nov. 13, 2020, entitled "OPTOELECTRONIC DEVICE AND ARRAY THEREOF", which is a continuation of U.S. patent application Ser. No. 16/985,008, filed Aug. 4, 2020, entitled "OPTOELECTRONIC DEVICE AND ARRAY THEREOF", which is a continuation of U.S. patent application Ser. No. 16/375,797, filed Apr. 4, 2019, entitled "OPTOELECTRONIC DEVICE AND ARRAY THEREOF", which claims priority to United Kingdom Patent Application No. 1805782.8, filed in the United Kingdom Intellectual Property Office on Apr. 6, 2018; the entire contents of all of the documents identified in this paragraph are incorporated herein by reference.

FIELD

Some embodiments of the present invention relate to a high-speed optoelectronic device having one or more curved waveguides curved in one direction.

BACKGROUND

In conventional optoelectronic devices an input waveguide couples a facet on a first edge of the device to an optically active region. An output waveguide then couples the optically active region to a facet on a second edge of the device, generally opposite the first.

However, such devices are more difficult to hybrid integrate into silicon and may involve longer driver interconnect lengths when in an array form as the active region cannot be located near the edge of the device.

SUMMARY

Some embodiments of the invention provide an optoelectronic device which utilizes curved waveguides formed of a material having a band-gap which is different from that of an optically active region. The optoelectronic device may have a high speed optoelectronic part and be connected by short traces to an electronic chip such as an ASIC. Shorter traces can advantageously lead to faster operation.

Accordingly, in a first aspect, some embodiments of the invention provide an optoelectronic device comprising: an optically active region with an electrode arrangement for applying an electric field across the optically active region; a first curved waveguide, arranged to guide light into the optically active region; and a second curved waveguide, arranged to guide light out of the optically active region; wherein the first curved waveguide and the second curved waveguide are formed of a material having a different band-gap than a band-gap of the optically active region, and wherein the overall guided path formed by the first curved waveguide, the optically active region and the second curved waveguide is U-shaped. That is to say, the first curved waveguide, second curved waveguide and the optically active material together form a waveguide U-bend. The optically active region and electrode arrangement together act as a high speed optoelectronic part fabricated in the active material of the optically active region, and located at the base of the "U".

This allows the high speed optoelectronic part of the optically active region to be located near an edge of the optoelectronic device, but to retain a device large enough to facilitate flip-chip bonding. Furthermore, by de-coupling the optically active region from the curved waveguides (which may be passive), the performance of the optically active region can be optimized without requiring modification of the curved waveguides.

The first curved waveguide or the second curved waveguide may be formed as epitaxially regrown waveguide(s).

The maximum distance between the first curved waveguide and the second curved waveguide may be no more than 250 µm for applications requiring high density integration of multiple optoelectronic devices in an array such as co-packaging with ASICs. The maximum distance may also be between 100 µm and 160 µm, or greater than 250 µm in applications where high density integration is not needed.

A radius of curvature of the first curved waveguide or the second curved waveguide may be less than 100 µm. The radius of curvature may be between 10 µm and 80 µm, for example between 30 um and 80 um.

The first curved waveguide and the second curved waveguide may each curve through an angle of 90°.

The optoelectronic device may further comprise first and second electrodes, said electrodes being disposed on a first side of the optically active region and electrically connected thereto. The first electrode may be a signal electrode and the second electrode may be a ground electrode. The optoelectronic device may further comprise a third electrode which is a second ground electrode.

The first curved waveguide and the second curved waveguide may be low-loss passive waveguides. By low-loss, it may be meant that the first and second curved waveguides incur less attenuation of an optical signal than the optically active region at a wavelength of operation of the optically active region.

The first curved waveguide or the second curved waveguide may be deep-etched waveguides. By deep-etched, it may be meant that either the waveguides are slab waveguides (as opposed to rib waveguides) or that a sidewall etch step is deeper than the centre of the optical mode of the waveguides. The deep-etched waveguides may be formed of indium phosphide.

The optoelectronic device may further comprise a passive low-loss input waveguide coupled to or provided as a continuation of the first curved waveguide; and a passive low-loss output waveguide coupled to or provided as a continuation of the second curved waveguide; wherein each of the input waveguide and the output waveguide have an end adjacent to a first edge of the optoelectronic device, and the same band-gap as the first and second curved waveguides. The first and second electrodes described above may be disposed adjacent to an edge of the optoelectronic device which is different from the first edge.

The optoelectronic device may further comprise: a distributed feedback laser, coupled to the first curved waveguide; and an output waveguide, coupled to or provided as a continuation of the second curved waveguide; such that the optoelectronic device is an electro-absorption modulated laser. The distributed feedback laser may be formed of a material having a band-gap which is the same as the band-gap of the optically active region, or may have a third band-gap different from that of both the optically active region and the first and second curved waveguides.

The high speed optoelectronic part of the optically active region may be an electro-absorption modulator. When a distributed feedback laser is also included, the device may be an electro-absorption modulated laser (EML). The high speed optoelectronic part may also be inter alia a MOS-CAP Mach-Zehnder modulator or a ring resonator modulator.

The first curved waveguide and the second curved waveguide may be formed of a material having a band-gap which is lower in wavelength than a band-gap of the optically active region.

Each of the first and second curved waveguides may take the form of an adiabatic bend.

In a second aspect, some embodiments of the invention provide an array of optoelectronic devices disposed on a chip, wherein: each optoelectronic device is set out as described in relation to the first aspect; and a distance between optically active regions of adjacent pairs of optoelectronic devices is no more than 250 μm.

Each optoelectronic device may have: an input waveguide coupled to or provided as a continuation of each first curved waveguide; and an output waveguide coupled to or provided as a continuation of each second curved waveguide; wherein each input waveguide and each output waveguide has a first end distal to its respective optically active region, and adjacent to a same side of the chip.

Each optoelectronic device may have: a distributed feedback laser, coupled to each first curved waveguide; and an output waveguide, coupled to or provided as a continuation of each second curved waveguide; such that the optoelectronic device is an electro-absorption modulated laser; wherein an end of each output waveguide distal to its respective optically active region is adjacent to a same side of the chip.

According to an embodiment of the present disclosure, there is provided a photonic chip, including: a waveguide; and an optically active device including a portion of the waveguide, the waveguide having: a first end at a first edge of the photonic chip; and a second end, and the waveguide having, everywhere between the first end and the second end, a rate of change of curvature having a magnitude not exceeding 2,000/mm².

In some embodiments, the area of a rectangle containing the waveguide is less than 1000 square microns.

In some embodiments, the length of a rectangle containing the waveguide is less than 200 microns.

In some embodiments, the width of a rectangle containing the waveguide is less than 80 microns.

In some embodiments, the waveguide includes a first tapered portion, having a wide end nearer the first end, and a narrow end nearer the second end.

In some embodiments, the wide end is within 10 microns of the first end.

In some embodiments, the length of the first tapered portion is within 30% of one third of the length of the waveguide.

In some embodiments, the waveguide has a first width at the wide end and a second width at the narrow end, and the first tapered portion has a length of at least 8 times the difference between the first width and the second width.

In some embodiments, the curvature of the waveguide at the first end is less than 0.1/mm.

In some embodiments, the curvature of the waveguide at the second end is less than 0.1/mm.

In some embodiments, the curvature at a point in the middle 80% of the waveguide is less than 0.1/mm.

In some embodiments, the waveguide is, at every point along the waveguide, within 3 microns of an adiabatic curve.

In some embodiments, the greatest value of the magnitude of the rate of change of curvature of the waveguide is within 40% of the average value of the magnitude of the rate of change of curvature of the waveguide.

In some embodiments, the waveguide is, at every point along the waveguide, within 3 microns of a Bezier spline.

In some embodiments, the waveguide has, at a first point along its length, an asymmetric profile.

In some embodiments, at the first point, the waveguide has a first sidewall having a first height and a second sidewall having a second height, the second height being at least 30% greater than the first height.

In some embodiments: the second end is at the first edge of the photonic chip; the waveguide has a first facet at the first end, and a second facet at the second end; the first facet is: oblique to the waveguide at the first end, and oblique to the first edge, a fundamental mode of the waveguide at the first end corresponds to a first free space beam outside the first facet, the first free space beam having a first centerline; a fundamental mode of the waveguide at the second end corresponds to a second free space beam outside the second facet, the second free space beam having a second centerline; and the first centerline is within 10 degrees of being parallel to the second centerline.

In some embodiments, the second centerline is within 10 degrees of a direction that is the mirror image of the direction of the first centerline.

In some embodiments: the first centerline is within 10 degrees of being perpendicular to the first edge, and the second centerline is within 10 degrees of being perpendicular to the first edge.

In some embodiments, the total direction change within the waveguide is less than 175 degrees.

In some embodiments, the total direction change within the waveguide is less than 155 degrees.

BRIEF DESCRIPTION OF THE DRAWINGS

Embodiments of the invention will now be described by way of example with reference to the accompanying drawings in which:

FIGS. 1A-1C each show a variant of an optoelectronic device, according to an embodiment of the invention;

FIG. 2 shows a further optoelectronic device, the device including a distributed feedback laser (DFB);

FIGS. 3A and 3B each show further optoelectronic devices, according to embodiments of the present invention, the optoelectronic devices including a semiconductor optical amplifier (SOA);

FIG. 8A is a plan view of a curved waveguide, according to an embodiment of the invention;

FIG. 8B is a graph of curvature as a function of length along a waveguide, according to an embodiment of the invention;

FIG. 8C is a graph of curvature as a function of length along a waveguide, according to an embodiment of the invention;

FIG. 8D is a graph of curvature as a function of length along a waveguide, according to an embodiment of the invention;

Figure 1C:
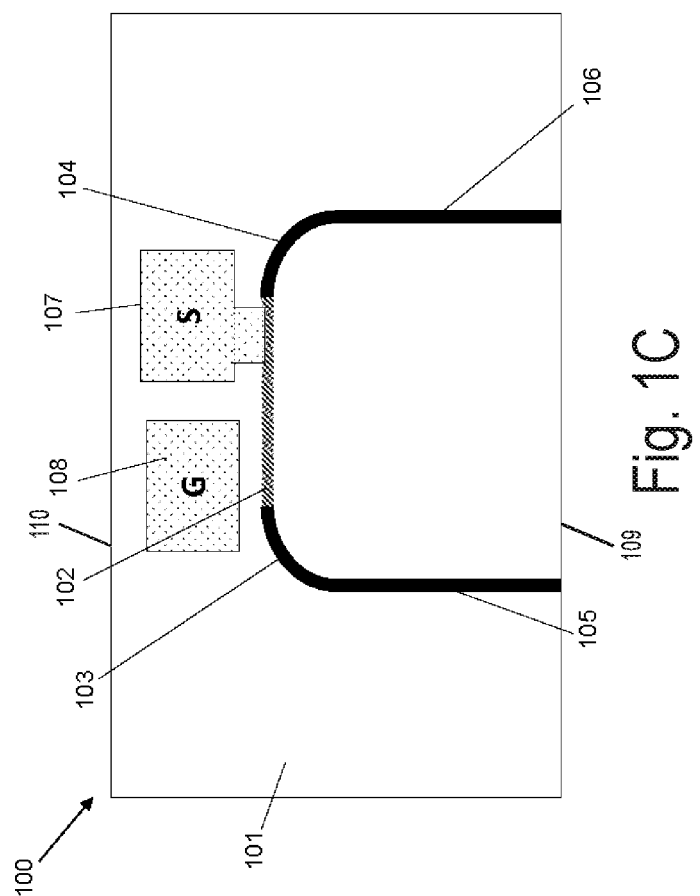

Each of FIGS. 7A, 8A, 9A, and 9B is drawn to scale, for a respective embodiment.

DETAILED DESCRIPTION

The detailed description set forth below in connection with the appended drawings is intended as a description of exemplary embodiments of an optoelectronic device and array thereof provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

FIG. 1A shows an optoelectronic device (or "photonic chip") 100. The device is formed on a III-V semiconductor chip or wafer 101 and is made with, for example, InGaAsP/InP or InAlGaAs/InP. The device generally comprises an optically active region 102, formed of a first material structure (for example InGaAsP or InAlGaAs multiple quantum well heterostructure, InGaAsP, or InAlGaAs bulk material) which has an associated band-gap. Adjacent to opposing ends of the optically active region are first 103 and second 104 curved waveguides. The first curved waveguide 103, the optically active region 102 and the second curved waveguide 104 together form a U-bend; a U-shaped guided optical path. The first and second curved waveguides are formed of or adjusted to have a material structure which has a different band-gap from that of the optically active region. The different bandgaps may be achieved, for example, by adjusting the atomic ratios of the elements in the InGaAsP or InAlGaAs quaternaries in certain layers, or by changing the thicknesses or material interface profile of the quantum wells in the multiple quantum well heterostructures. The band-gap in the waveguides is typically made to be lower in wavelength (i.e., higher in energy) than that in the optically active region. The band-gap difference may correspond to a wavelength difference of 50-100 nm, and in some examples may correspond to a wavelength difference of up to 200 nm. The first and second curved waveguides are passive devices in that they are not used to actively modulate optical signals being passed therethrough. In the example shown in this figure, the curved waveguides have an effective radius of curvature of 50 µm, or around 50 µm. The curved waveguides may be regrown so as to change the band-gap of the curved waveguides relative to the optically active region 102. The degree of curvature of the curved waveguides may be described as a tight bend or adiabatic bend. The degree of curvature in this example is 90°.

Regrowing is a process where a portion of the existing semiconductor optically active material is etched away, and then a second optically active material with a different band-gap wavelength (e.g. with different atomic ratios of elements, or different quantum well thicknesses) is re-grown into the region that was etched away. The regrowth may be epitaxial.

An input waveguide 105 couples a first edge 109 of the chip 101 to one end of the first curved waveguide 103. Similarly, an output waveguide 106 couples the second curved waveguide 104 to the same edge 109 of the chip 101. The input and output waveguides are either distinct waveguides from the first and second curved waveguides or provided as continuations thereof, and may have the same band-gap as the curved waveguides 103 and 104. The input and output waveguides may be coupled to tapers or mode converters near the first edge 109 of the chip 101. The first edge 109 may be one of a plurality of edges (e.g., of 4 edges, if the chip is rectangular) formed when a wafer is diced into a plurality of chips, of which the chip is one. As such, the first edge 109 may be an edge of the substrate.

The device also includes a signal electrode 107 and ground electrode 108 to electrically drive the optically active region. In this example, both electrodes are disposed adjacent to a second edge 110 of the chip, which is on an opposite side to the first edge 109 adjacent to the input and output waveguides. As both electrodes are on the same edge of the chip, this allows flip-chip bonding with short RF traces or wire bonding with short wire bond lengths to an off-chip driver chip. The distance between the input waveguide 105 and the output waveguide 106 in the device may be used to determine an overall 'width' of the optoelectronic device. This width may be less than 250 µm, and may be between 100 µm and 160 µm.

FIG. 1B shows a variant device which differs from the device of FIG. 1A in that an additional ground electrode 111 is disposed on an opposing side of the source or signal electrode 107 to the first ground electrode 108. Aside from this, the device is identical to that shown in FIG. 1A. Similarly, the device shown in FIG. 1C differs from that shown in FIG. 1A in that the ground electrode 108 and the source or signal electrode 107 have been swapped so that the ground electrode 108 is located proximate the first curved waveguide 103 and the source/signal electrode 107 is located proximate the second curved waveguide 104.

FIG. 2 shows an alternative device 200, which shares a number of features with the device 100 discussed above. Like features are indicated by like reference numerals. The device 200 in FIG. 2 however contains a distributed feedback laser 201 instead of the input waveguide 105 (as discussed above). The laser is coupled to the first curved waveguide 103, so as to provide laser light to the optically active region 102. The distributed feedback laser 201 may be formed of a material having a band-gap which is the same (or substantially the same) as the optically active region. Alternatively, it can formed of a material having a band-gap which is different from both the optically active region and the passive waveguide regions. Whilst not shown, the electrodes 107 and 108 in the device 200 can have any of the configurations described above in FIGS. 1A-1C.

FIG. 3A shows an alternative device 300A, which shares a number of features with the device 100 discussed above. Like features are indicated by like reference numerals. The optically active region 102 forms a high speed optoelectronic device such as an electro-absorption modulator EAM. The device 300A differs from the device 100 shown in FIG. 1C in that it further comprises a semiconductor optical amplifier (SOA), the SOA including a further optically active region 112, a further ground electrode 118, and a further source electrode 117. The EAM and SOA are typically formed of the same semiconductor materials but may be different on structure and/or compositions. The EAM and SOA are both located at the base of the U-bend, in between the first curved waveguide 103 and the second curved waveguide 104.

FIG. 3B shows an alternative device 300B, which shares a number of features with the device 300A discussed above in relation to FIG. 3A. Again, like features are indicated by like reference numerals. The device differs from that of FIG. 3A in that it includes a distributed feedback laser 201 coupled to the first curved waveguide 103. The device differs from that of FIG. 2 in that it comprises a SOA region located at the base of the U-bend, adjacent the optically active region 102 of the EAM.

Figure 4B:
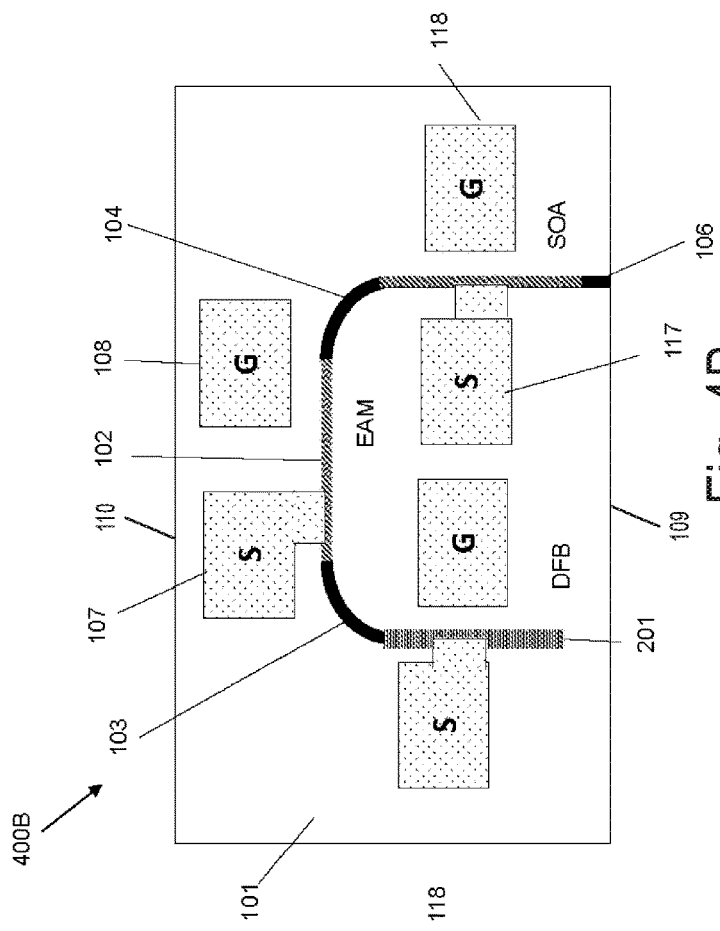
FIGS. 4A and 4B each show yet further optoelectronic devices, according to embodiments of the present invention, where these devices also include a semiconductor optical amplifier.
Figure 4A:
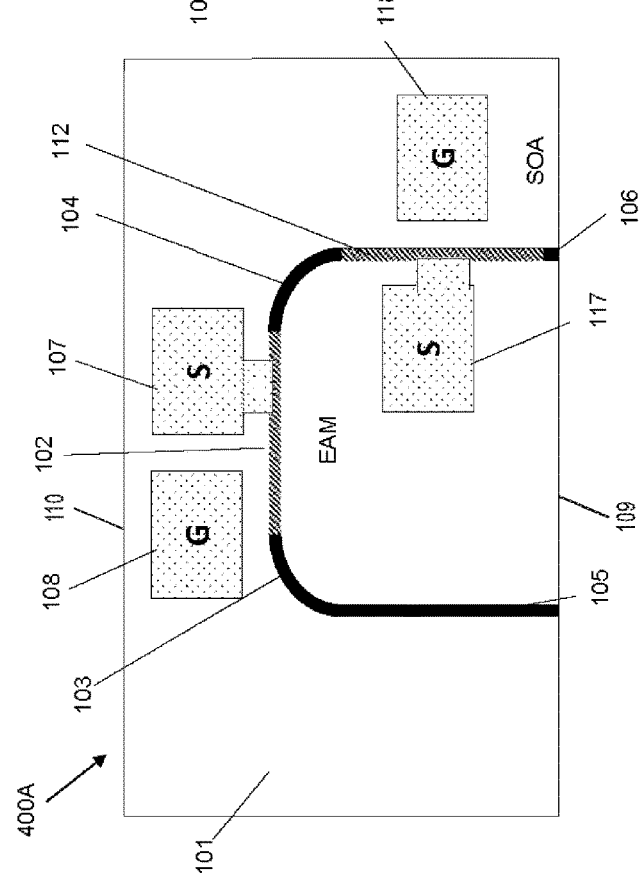

FIGS. 4A and 4B show alternative devices which differ from the devices of FIGS. 3A and 3B respectively in that rather than being located at the base of the U-bend, the SOA is located at the other side of the second curved waveguide 104 from the first optically active region 102 of the EAM. In other words, the SOA is located on the leg of the U-bend, along the output waveguide 106.

In each of the embodiments described above in relation to FIGS. 3A, 3B, 4A and 4B, the electrode pads 107, 108, 117, 118, could be positioned in other locations and in other configurations. The DFB and SOA pads are DC pads and so may be positioned away from the edge of the die. However, the EAM pads are RF pads and may therefore be located close to the edge of the die.

FIGS. 3A and 3B show the SOA also at the edge and close to the EAM. Thus there could be a single driver chip (DC and RF), but it is noted that the spacing of the waveguides is quite large. To reduce the spacing, an arrangement such as FIGS. 4A and 4B can be used but here the EAM is distant from the SOA and so the RF (high speed) driver may be a separate chip from the DC driver/source.

In any one of the embodiments described above, the DFB and SOA may be forward biased whilst the EAM may be reverse biased.

Figure 5:
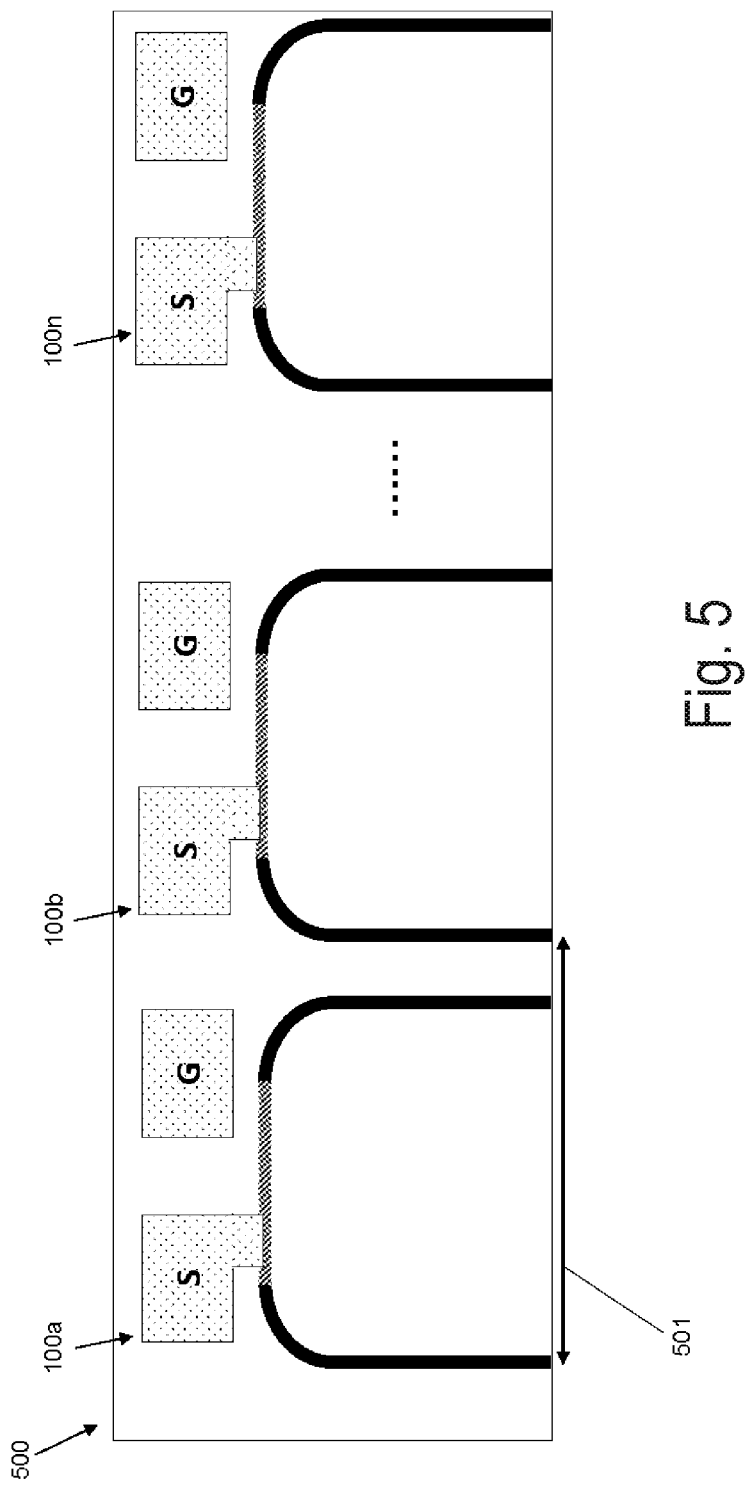
FIG. 5 shows an array of optoelectronic devices, according to an embodiment of the invention.

FIG. 5 shows an array 500 of high speed optoelectronic devices 100a-100n disposed on a single wafer or chip. As can be seen, all of the input and output waveguides are coupled to the same edge of the chip which can facilitate flip-chipping to a host PIC with only one side of the chip requiring precise alignment to the host PIC waveguides, or fiber attachment to only one side of the chip, and installation in an optical network. Of note is the pitch 501 between devices i.e. the distance between like features in adjacent optoelectronic devices 100a-100n. For example, the distance between the input waveguide in optoelectronic device 100a and the respective input waveguide in the optoelectronic device 100b may be referred to as the pitch. The pitch is generally less than 250 μm.

Figure 6:
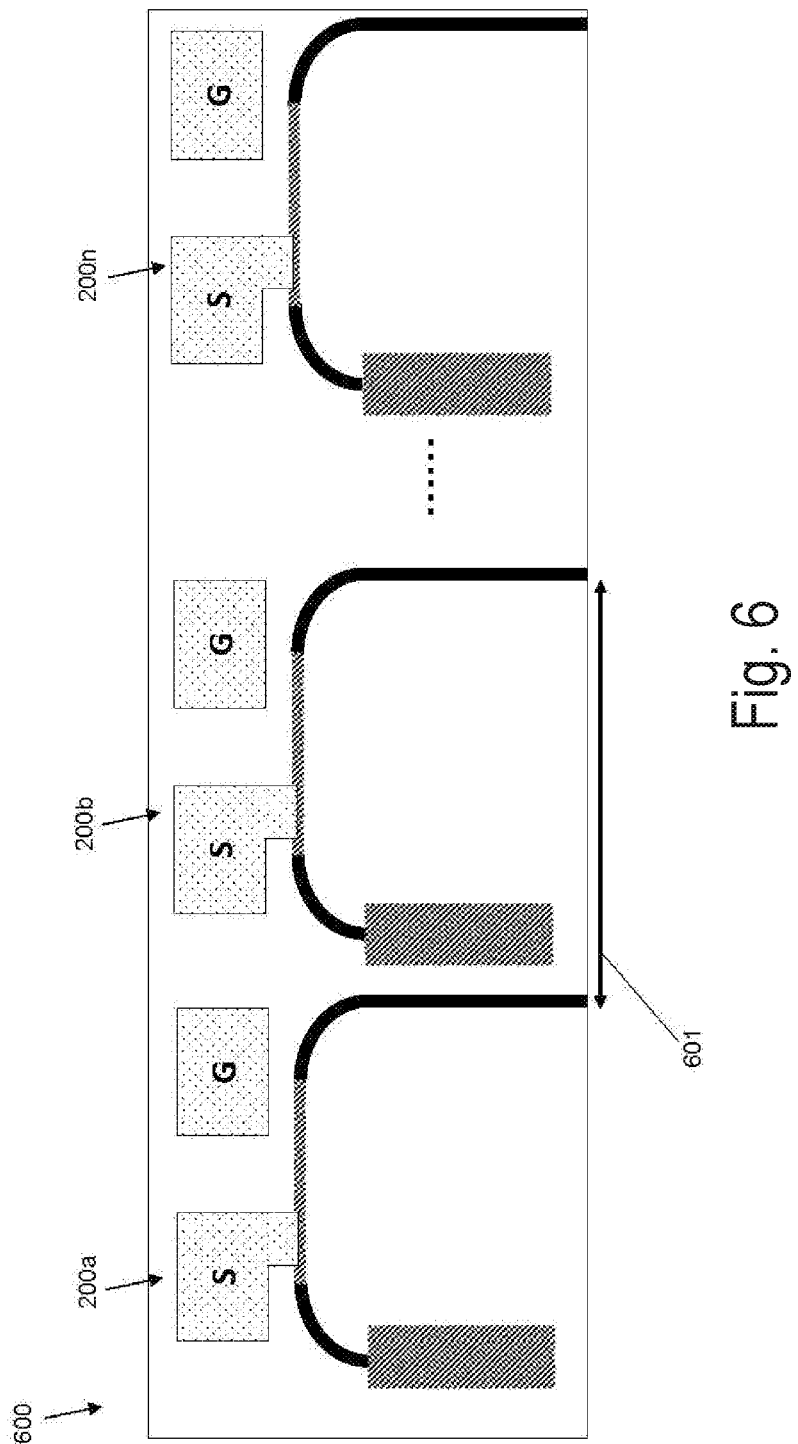
FIG. 6 shows an array of optoelectronic devices, according to an embodiment of the invention.

FIG. 6 shows an alternative array 600 of high speed optoelectronic devices 200a-200n disposed on a single wafer or chip. As can be seen, all of the output waveguides are coupled to the same edge of the chip which can facilitate flip-chipping to a host PIC with only one side of the chip requiring precise alignment to the host PIC waveguides, or fiber attachment to only one side of the chip, and installation in an optical network. Of note is the pitch 601 between devices, i.e., the distance between like features in adjacent optoelectronic devices 200a-200n. For example, the distance between the output waveguide in optoelectronic device 200a and the respective output waveguide in the optoelectronic device 200b may be referred to as the pitch. The pitch is generally less than 250 μm.

Whilst not shown, an array of optoelectronic devices as described above may include at least one optoelectronic device according to FIGS. 1A-1C and at least one optoelectronic device according to FIG. 2.

In some embodiments, an optoelectronic device may include an optically active region that is within, includes, or is a section of waveguide (e.g., a curved section of waveguide), and the optoelectronic device may be considered to include a single waveguide extending from a first facet (e.g., an input facet), at a first edge 109 of the semiconductor chip 101 through one or more optically active devices, to a second facet (e.g., an output facet) at the first edge 109 of the semiconductor chip 101. The curvature of the waveguide may vary continuously along the length of the waveguide, i.e., abrupt changes in curvature (which, if present, could cause optical loss or the coupling of light into higher order modes) may be absent. As used herein, the "curvature" of the waveguide is the reciprocal of the radius of curvature. A bend or curve in which the curvature varies continuously may be referred to as an "adiabatic" bend or curve.

Figure 7A:
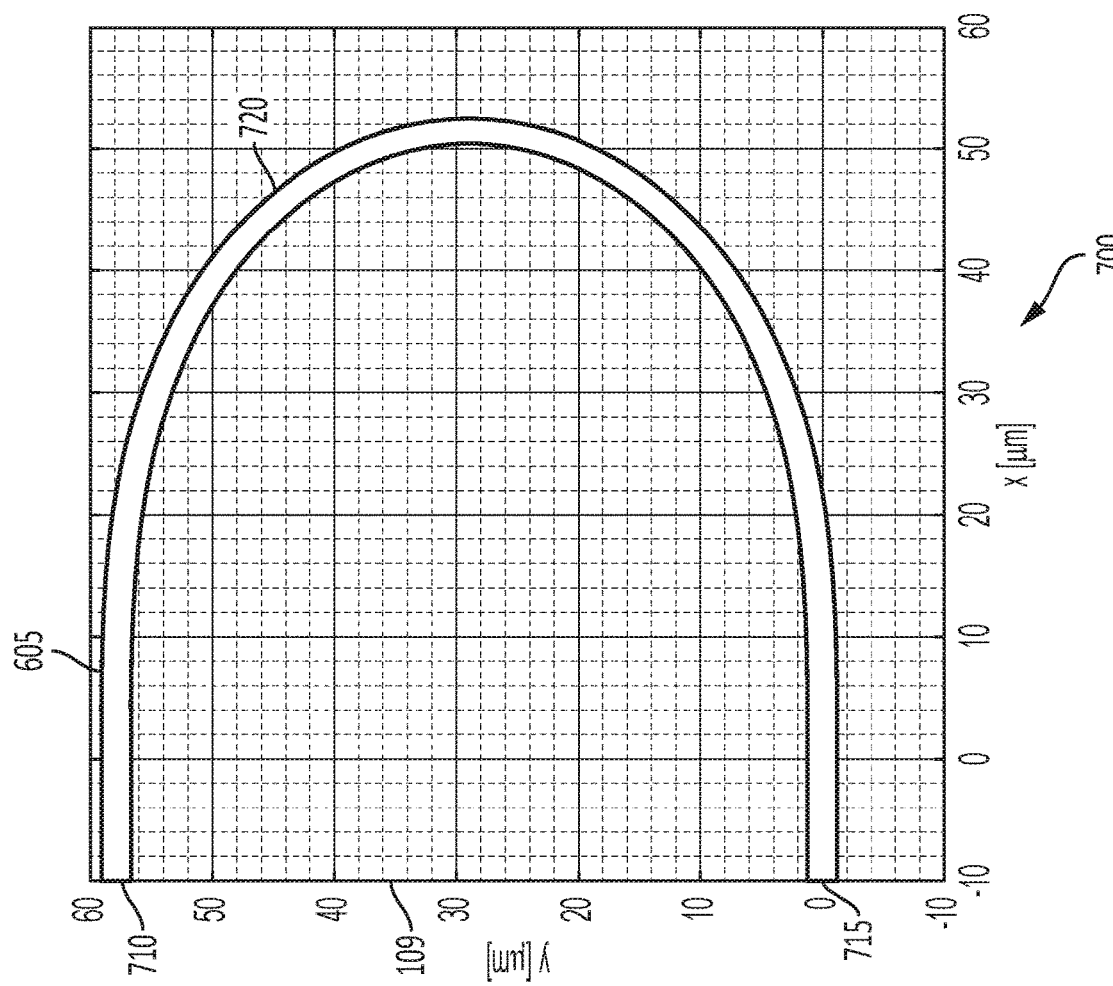
FIG. 7A is a plan view of a curved waveguide, according to an embodiment of the invention.

FIG. 7A shows an optoelectronic device 700 including such a waveguide, in some embodiments. The waveguide 605 extends from a first facet 710 to a second facet 715 and includes an optically active region 720, which may extend along the entire waveguide, as shown in FIG. 7A. The optoelectronic device 700 may include an optically active device, which may include (i) the optically active region 720 and (ii) electrodes (not shown) in the optically active region 720. The electrodes may produce an electric field, or cause an electrical current to flow, in the optically active region, changing the optical characteristics (e.g., the optical attenuation length) in the optically active region, and, e.g., if the voltage or current varies with time, causing the optically active device to modulate light propagating through the waveguide 605. In some embodiments, the optoelectronic device 700 may include, in a manner analogous to that of, e.g., FIGS. 3A-4B, more than one optically active device each including a respective optically active region of the waveguide 605 (which may have several optically active regions). As used herein, an "optically active device" is a device in which, in operation, an electrical current or voltage interacts with light (e.g., light propagating in a waveguide) to (i) generate the light (e.g., if the optically active device is or includes a laser) or to (ii) modify the characteristics of the light (e.g., to amplify the light if the optically active device is or includes a semiconductor optical amplifier, or to modulate the amplitude or phase of the light, if the optically active device is or includes an amplitude modulator or a phase modulator). As used herein, an "optically active region" is a portion of a waveguide that, in operation, (i) generates light (e.g., in a semiconductor laser) or (ii) modifies the characteristics of light propagating in the waveguide, as result of a voltage applied to, or a current flowing through, the optically active region.

Figure 7B:
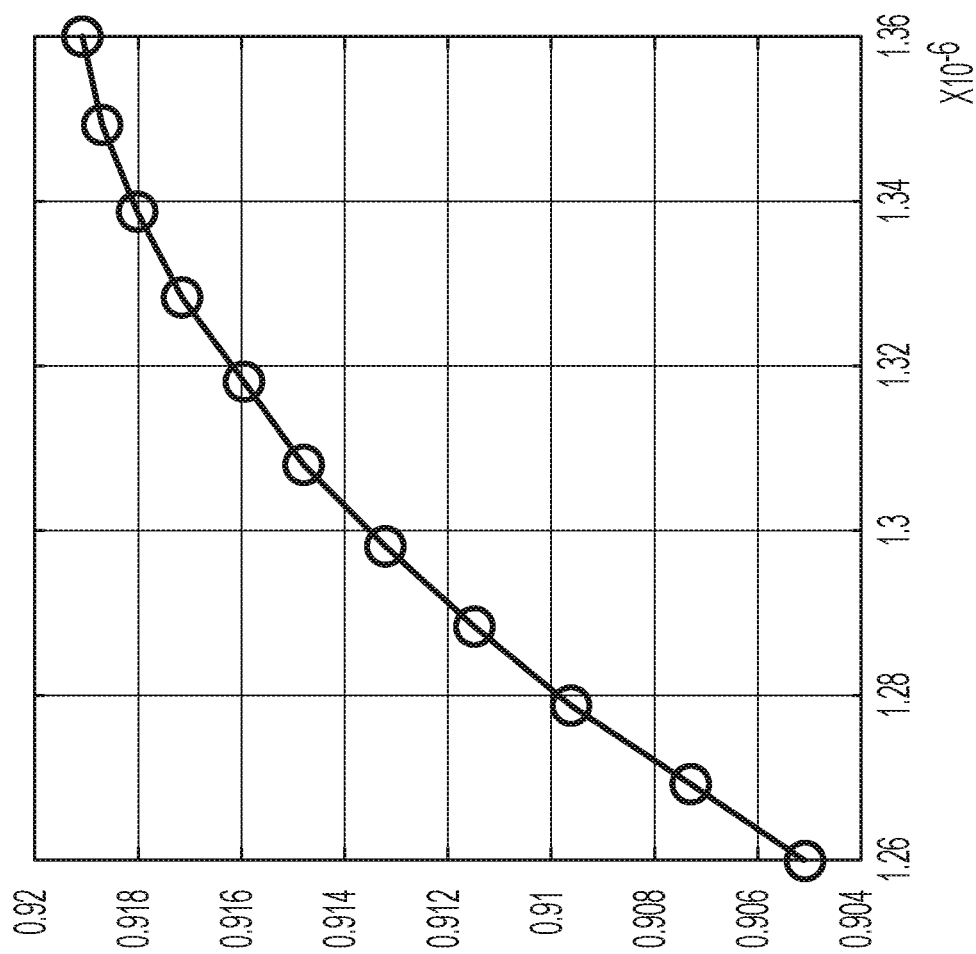
FIG. 7B is a graph of transmissivity as a function of wavelength, according to an embodiment of the invention.

The waveguide 605 may include one or more tapered portions so that the width of the waveguide 605 is smaller in the optically active region 720 than at the facets 710, 715. Each tapered portion may be straight, or a portion of the tapered portion may be curved. A narrower waveguide may result in a smaller capacitance between the electrodes and, e.g., if the optically active device is a modulator, improved modulation bandwidth. A wider waveguide at the first facet 710, on the other hand, may result in a free-space beam, outside the first facet 710, that may be more efficiently coupled to a corresponding waveguide, on another semiconductor chip, having a facet opposite the first facet 710. A wider waveguide at the second facet 715 may have similar advantages. As such, it may be advantageous for the waveguide 605 to include a first tapered portion having a wide end (with, e.g., a width between 2.0 microns and 5.0 microns) at the first facet 710 and a narrow end (with, e.g., a width between 0.5 microns and 2.0 microns) nearer the middle of the waveguide 605 and a second tapered portion having a wide end at the second facet 715 and a narrow end nearer the middle of the waveguide 605. In a semiconductor chip 101 composed of a III-V semiconductor (e.g., InP), each tapered portion may have a length equal to at least ten times the change in the width of the waveguide. For example, in the embodiment of FIG. 7A, the width of the waveguide 605 at each of the facets 710, 715 may be 2.5 microns, and the width of the waveguide 750 at the midpoint between the facets 710, 715 may be 2.0 microns; in this case the length of each tapered portion may be at least ten times (2.5 microns-2.0 microns) in length (where (2.5 microns-2.0 microns) is the change in the width of the waveguide), i.e., each tapered portion may be at least 5 microns in length (e.g., it may be between 5 and 20 microns in length). Each tapered portion may have a linear taper (i.e., the width of the waveguide may be a linear function of length along the waveguide) or a nonlinear (e.g., polynomial (e.g., parabolic)) taper. FIG. 7B shows the simulated transmissivity of the waveguide of FIG. 7A, as a function of wavelength, for light propagating from just inside the second facet 715 to just inside the first facet 710.

In some embodiments the facets 710, 715 may be angled instead of being square (i.e., instead of being parallel to the first edge 109). The angling of the facets may (i) reduce back-reflections (i.e., reflections from the facets that couple to the fundamental modes of the waveguide) and (ii) make it possible to reduce the total angle change of the curved waveguide, making possible more compact designs, or reduced loss, or both.

FIG. 8A shows an example of such a design. In part because the facets are angled, the waveguide is not perpendicular to the first edge 109 at the first facet 710 and at the second facet 715, with the result that the total direction change of the waveguide is less than 180 degrees. As a result, the optoelectronic device may be more compact, or have a smaller maximum curvature (or both) than one in which the waveguide is perpendicular to the first edge 109 at the first facet 710 and at the second facet 715. A smaller maximum curvature may result in lower insertion loss. The maximum curvature may be between 5/mm and 100/mm, e.g., it may be about 30/mm, and the rate of change of curvature may be, everywhere along the waveguide, less than a maximum rate of change of curvature, the maximum rate of change of curvature being between 100/mm$^2$ and 10,000/mm$^2$, e.g., it may be about 1,000/mm$^2$. FIG. 8A is labeled with dimensions in microns; it may be seen that the waveguide fits within a rectangle having a width of 40 microns, and a length of 100 microns (i.e., a rectangle containing the waveguide may have dimensions of 40 microns by 100 microns, and an area of 400 square microns). As used herein, the "length" of a rectangle is the longer dimension of the rectangle, and the "width" of the rectangle is the shorter dimension of the rectangle (and, if the rectangle is a square, the length and width are both equal to the side length of the square).

The waveguide of FIG. 8A may have the shape of an adiabatic curve including four equal-length adiabatic segments 805, 810, 815, 820. FIG. 8B shows the curvature of the waveguide as a function of length along the waveguide. As illustrated in FIG. 8B, in the embodiment of FIG. 8A the curvature increases at a constant rate along the waveguide over the first adiabatic segment 805 to a maximum curvature $C_m$, decreases at a constant rate, back to zero over, the second adiabatic segment 810, increases at a constant rate to $C_m$ over the third adiabatic segment 815, and decreases at a constant rate, back to zero, over the fourth adiabatic segment 820. The magnitude of the rate of change of curvature may constant over all of the segments, as illustrated in FIG. 8B. In some embodiments, the magnitude of the rate of change of curvature is not constant but varies relatively little, so that, for example, the greatest value of the magnitude of the rate of change of curvature of the waveguide is within 40% of the average value of the magnitude of the rate of change of curvature of the waveguide. In some embodiments, the waveguide may follow a nominal curve (e.g., an adiabatic curve, or a curve including clothoid segments, as discussed below) approximately, e.g., at every point along a segment of the waveguide, the waveguide may be within 3 microns of the nominal curve.

FIGS. 8C and 8D show the curvature as a function of length along the waveguide for other embodiments. The embodiment of FIG. 8C includes a first adiabatic segment 805 having the same shape as the first adiabatic segment 805 of the embodiment of FIG. 8B, a second adiabatic segment 822 that is a circular arc with a curvature $C_m$, and a third adiabatic segment 820 having the same shape as the fourth adiabatic segment 820 of the embodiment of FIG. 8B. The embodiment of FIG. 8D includes a first adiabatic segment 824 within which the curvature increases to a maximum curvature $C_m$, and a second adiabatic segment 826 within which the curvature decreases at a constant rate back to zero. The embodiments of FIGS. 8C and 8D may each have the same area under the curve (of curvature as a function of length along the waveguide), and therefore the same total change in angle, as the embodiment of FIGS. 8A and 8B. The embodiment of FIG. 8C may have a shorter total length than the embodiment of FIG. 8B, and the embodiment of FIG. 8D may have a lower rate of change of curvature than the embodiment of FIG. 8B. Each of the embodiments of FIGS. 8B, 8C, and 8D has mirror symmetry; in some embodiments this symmetry is absent. For example, the curvature as a function of length along the waveguide may be like that of FIG. 8D, with the first adiabatic segment being shorter, and having a higher rate of change of curvature, than the second adiabatic segment (while preserving the area under the curve). As used herein, an "adiabatic segment" is a length of waveguide within which the curvature changes at a constant rate with length along the waveguide. As used herein, an "adiabatic curve" is a curve consisting of one or more adiabatic segments (e.g., of between 1 and 10 adiabatic segments), and within which the direction and curvature are continuous at the transition between any two adjoining segments. In some embodiments, one or more segments of the waveguide are clothoid bends, e.g., bends like those of FIG. 8A except that instead of varying linearly within each such segment, the curvature may vary nonlinearly (and continuously). As used herein, a "clothoid" bend is a bend within which the curvature varies continuously (as such, an adiabatic bend is an example of a clothoid bend). In FIGS. 8B-8D, positive curvature corresponds to a clockwise curvature, in a direction proceeding from the first facet 710 to the second facet 715. The convention used in FIGS. 8B-8D for the sign of the curvature has (like the convention used herein in the context of FIGS. 8G-8I) the effect that a waveguide that is curved so as to be concave toward the first edge 109 has positive curvature.

Figure 8E:
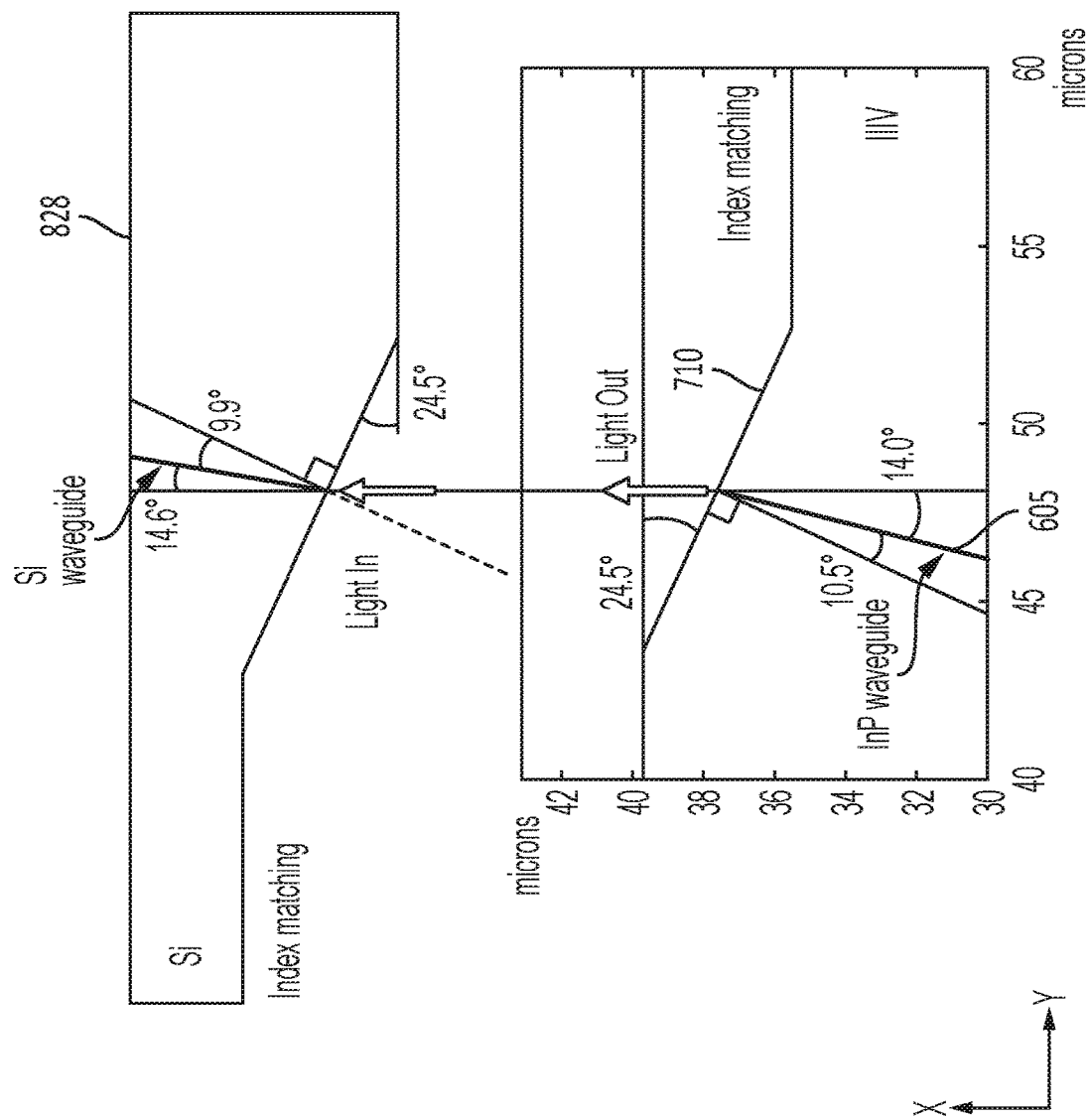
FIG. 8E is a plan view of a portion of a III-V chip and a portion of a silicon chip, according to an embodiment of the invention.

In the embodiment of FIG. 8A, the angle of the waveguide at the first facet 710, and the angle of the first facet, may be selected such that a fundamental mode of the waveguide is coupled to a free space beam, outside the first facet 710, that has a centerline (e.g., a line passing through the centroid of the transverse intensity profile) perpendicular, or nearly perpendicular (e.g., within an angle between 0.01 degrees and 20.00 degrees of being perpendicular) to the first edge 109. As shown in in FIG. 8E, the angle between the facet normal (the facet normal being the direction perpendicular to the facet) and the waveguide may be 10.5 degrees, and the angle between the edge normal (the edge normal being the direction perpendicular to the first edge 109) and the waveguide may be 14.0 degrees. Two angles at the first facet 710, (i) the angle between the facet normal and the waveguide and (ii) the angle between the free space beam and the facet normal, may be related by Snell's law. FIG. 8E also shows a portion of a corresponding second chip (e.g., a silicon chip) 828 having a facet parallel to the first facet 710. The silicon chip 828 is shown out of position so that the features of the III-V semiconductor chip and the features of the silicon chip 828 are more clearly visible; in an assembled system, the facet of the silicon chip 828 and the first facet 710 may be nearly in contact, e.g., separated by a gap of about 1 micron (e.g., a gap between 0.5 microns and 1.5 microns). The silicon chip 828 may have a facet that is parallel to the first facet 710 (or sufficiently close to parallel to avoid contact between the two chips when the gap between the ends of the waveguide is, e.g., between 0.5 microns and 1.5 microns), and a waveguide that is at a different angle from that of the waveguide 605 of the III-V chip, because of the difference between the index of refraction of the III-V material (e.g., 3.32) and the index of refraction of silicon (e.g., 3.47) (the index of refraction of an index matching material that may be present in the gap may be 1.46). The silicon chip 828 may have a second facet (not shown in FIG. 8E) and light may couple between the second facet of the silicon chip 828 and the second facet 715 of the optoelectronic device 700 in a manner analogous to that illustrated in FIG. 8E. The III-V semiconductor chip and the features of the silicon chip 828 may be flip-chip mounted on the silicon chip, and, as such, the substrates of the two chips may not interfere.

The angles of the waveguides and facets (in the III-V semiconductor chip and in the silicon chip) at the second facet 715 may be the mirror images of those at the first facet 710. Such a configuration may have the characteristic that ellipses of constant insertion loss (as a function of misalignment in the X and Y directions shown in FIG. 8E) may have a major axis parallel to or perpendicular to the first edge 109. This may mean that the alignment in the Y direction for which the transmission is greatest is substantially independent of the width of the gap (i.e., the width of the gap between (i) the waveguide facet on the silicon chip 828 and (ii) the first facet 710). For example, the Y offset for which the transmission is greatest may vary by less than 200 nm, or even less (e.g., by less than 50 nm or by less than 10 nm) for gap widths between 0.5 microns and 1.5 microns. Further, the reflection may have relatively little dependence on both the gap and the alignment in the Y direction. This may facilitate an active alignment process performed using a bonding tool having X and Y axis motion control of the bond head and movements that are thus on a rectilinear grid. Alignment may be performed, using such a tool, by adjusting the relative positions of the III-V semiconductor chip (e.g., the optoelectronic device) and the silicon chip while monitoring the optical insertion loss.

Figure 8F:
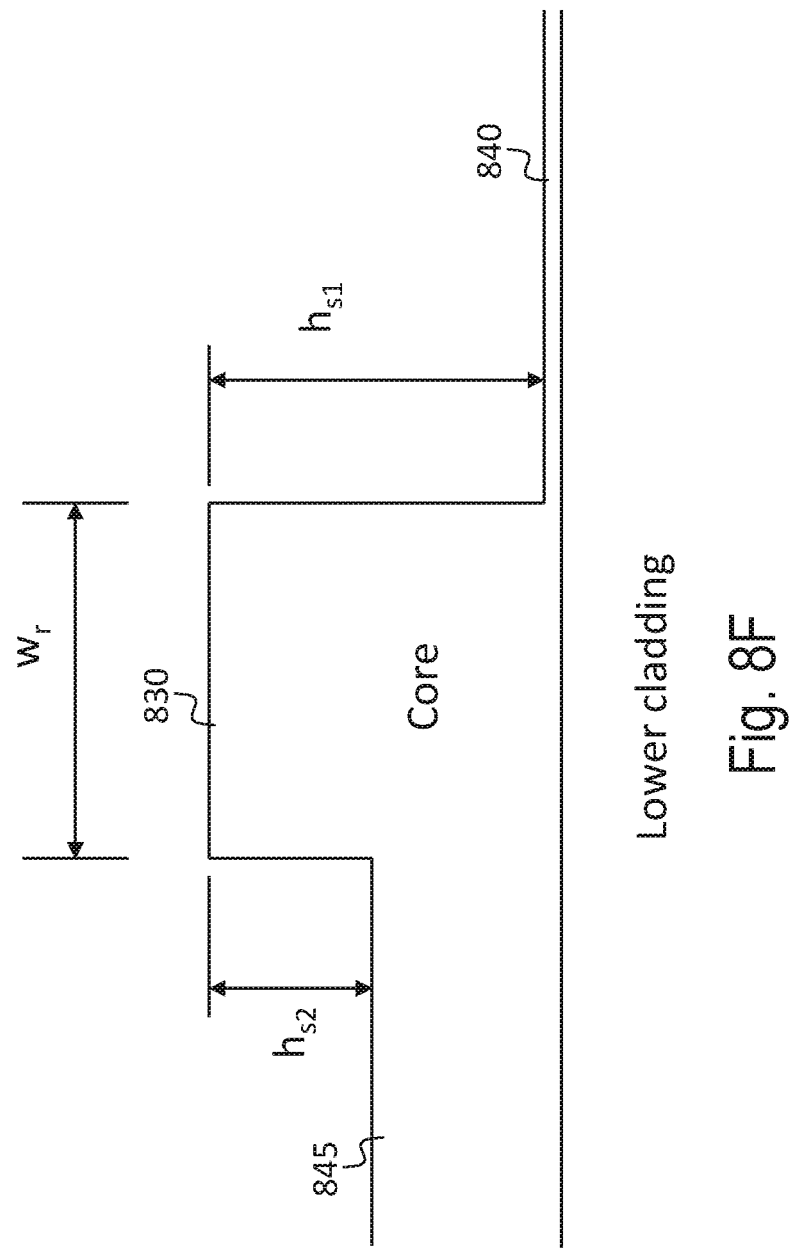
FIG. 8F is a cross-sectional view of a waveguide, according to an embodiment of the invention.

In some embodiments the cross-sectional shape of the waveguide may be as shown in FIG. 8F. The waveguide may include a core having a waveguide ridge 830. A first slab 840 having a first thickness may be on one side of the waveguide ridge 830, and a second slab 845 having a second thickness may be on the other side of the waveguide ridge 830. The waveguide ridge 830 may have a first sidewall with a first sidewall height $h_{s1}$ and a second sidewall having second sidewall height $h_{s2}$. At points along the waveguide at which the curvature is small, the waveguide may be a strip waveguide with a first sidewall height approximately equal to the second sidewall height, and with both the first slab 840 and the second slab 845 being sufficiently thin to have little effect on the shape of the fundamental (TE00 and TM00) modes of the waveguide. At points along the waveguide at which the curvature is significant, the waveguide may be asymmetric, and, e.g., the sidewall height on the inside of the curve may be reduced (and the thickness of the slab on the inside of the curve correspondingly increased), to reduce optical loss caused by surface roughness of the second sidewall. In some embodiments, the second sidewall height $h_{s2}$ is zero; in some embodiments, the second sidewall height $h_{s2}$ is between 0% and 100% of the first sidewall height $h_{s1}$.

Any configuration in which the angles of the waveguides and facets (in the III-V semiconductor chip and in the silicon chip) at the second facet 715 are the mirror images of those at the first facet 710 may, like the configuration of FIG. 8A, have the characteristic that ellipses of constant insertion loss (as a function of misalignment in the X and Y directions shown in FIG. 8E) have a major axis parallel to or perpendicular to the first edge 109 (where insertion loss is defined as the loss experienced by light propagating from a first waveguide on the silicon chip 828, across a first gap into the waveguide 605 on the optoelectronic device 700, along the length of the waveguide 605, and across a second gap into a second waveguide on the silicon chip 828). The ellipticity of the ellipses of constant insertion loss may be greatest when the free space beams are parallel, as in the embodiment of FIGS. 8A and 8E, and the ellipticity may be least if the free space beams are perpendicular (e.g., with each free space beam being at 45 degrees from the first edge 109). In some embodiments the precision of the bond head is anisotropic (e.g., better in X than in Y) and the ellipticity of the ellipses of constant insertion loss is selected to minimize the expected insertion loss. Moreover, any configuration in which the free space beams are parallel may have the characteristic that ellipses of constant insertion loss have relatively high ellipticity, regardless of whether the beams are perpendicular to the first edge 109. If the free space beams are not perpendicular to the first edge 109, then the ellipses of constant insertion loss may have a major axis that is aligned with the beams (and also not perpendicular to the first edge 109). In any such circumstance, the chips may be oriented relative to the higher-precision direction of the bond head so as to minimize the expected insertion loss (e.g., with the higher-precision direction of the bond head aligned with a minor axis of an ellipse of constant insertion loss).

Figure 8G:
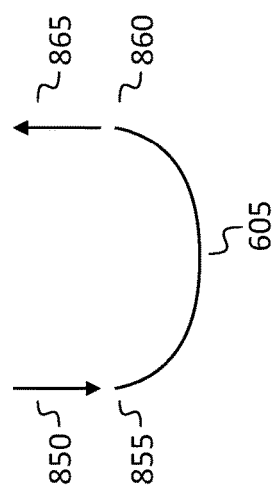
FIG. 8G is a schematic propagation diagram, according to an embodiment of the invention.
Figure 8H:
FIG. 8H is a schematic propagation diagram, according to an embodiment of the invention.
Figure 8I:
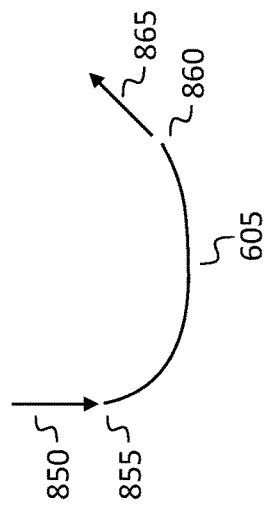
FIG. 8I is a schematic propagation diagram, according to an embodiment of the invention.

FIG. 8G is a schematic propagation diagram. A first free-space beam 850 (e.g., transmitted by a second chip, such as the silicon chip 828) is incident on a first end 855 of the waveguide 605, and the light propagates through the waveguide 605, and is transmitted, from a second end 860 of the waveguide 605, as a second free-space beam 865. Using the convention that light received, by the optoelectronic device 700, in a direction perpendicular to the first edge 109 (not shown in FIG. 8G) is propagating at an angle of 0 degrees, and that counterclockwise direction changes have a positive sign, it may be seen that in FIG. 8G the light in the first free-space beam 850 propagates at an angle of 0 degrees, and the light makes a first positive direction change at the first end 855 of the waveguide 605 (e.g., a direction change of 14 degrees, if the geometry is the mirror image of that shown in FIG. 8E, with the light being incident on the facet at an angle of 24.5 degrees from the facet normal, and refracting, upon entering the waveguide (because the change in index of refraction), to an angle of 10.5 degrees from the facet normal). The light then makes a further direction change of, e.g., 152 degrees, as it propagates through the curved waveguide 605 (i.e., the total direction change within the waveguide 605 is 152 degrees), and another direction change at the second end 860 of the waveguide 605 (e.g., a direction change of another 14 degrees, if the geometry is that shown in FIG. 8E), for a total direction change of 180 degrees (of which 28 degrees occur at the two ends 855, 860 of the waveguide 605 (i.e., at the angled facets (not shown in FIG. 8G) at those two ends), and 152 degrees occurs in the curved waveguide 605). The light in the second free-space beam 865, transmitted by the optoelectronic device 700, propagates at an angle of 180 degrees. The convention used herein in the context of FIGS. 8G-8I (like the convention used in FIGS. 8B-8D for the sign of the curvature) has the effect that a waveguide 605 that is curved so as to be concave toward the first edge 109 has a positive total change in direction (or "direction change"), and, as used herein, a change in direction, or direction change, within the waveguide is defined to be (i) positive if it results, or tends to result, in the waveguide being curved so as to be concave toward the first edge 109, and (ii) negative if it results, or tends to result, in the waveguide being curved so as to be convex toward the first edge 109. The total direction change in the waveguide 605 may, in various embodiments, be between −15 degrees and 200 degrees, with the example of a total direction change of 152 degrees given above being within this range (i.e., the range from −15 degrees to 200 degrees), and with other examples within this range being given below. FIGS. 8G-8I are schematic drawings, and are not drawn to scale.

In some embodiments, the received free space beam is at an angle different from 0 degrees, or the transmitted free space beam is at an angle different from 180 degrees. For example, in the embodiment of FIG. 8H, the received free space beam propagates at an angle of 45 degrees, and the transmitted free space beam propagates at an angle of 135 degrees, so that (if the direction change at each facet is 14 degrees) the light makes a direction change of 62 degrees as it propagates through the curved waveguide 605. In some embodiments, the angle between the free space beam and the facet normal is different from 24.5 degrees at the first end 855 or at the second end 860, or the ratio of refractive indices at the facet is different from 3.32/1.46. In such an embodiment the angle change at the facet may be greater or less than 14 degrees. In some embodiments (e.g., if the received free space beam is at an angle of 76 degrees, and the transmitted free space beam is at an angle of 104 degrees, and the direction change at each facet is 14 degrees), the waveguide 605 is straight or substantially straight (e.g., in the waveguide 605 the light changes direction by an angle between 0 degrees and 20 degrees (or, in some embodiments, between −15 degrees and 30 degrees)). In some embodiments the geometry of the waveguide 605 and of the facets lacks mirror symmetry, as illustrated for example in FIG. 8I.

Figure 9A:
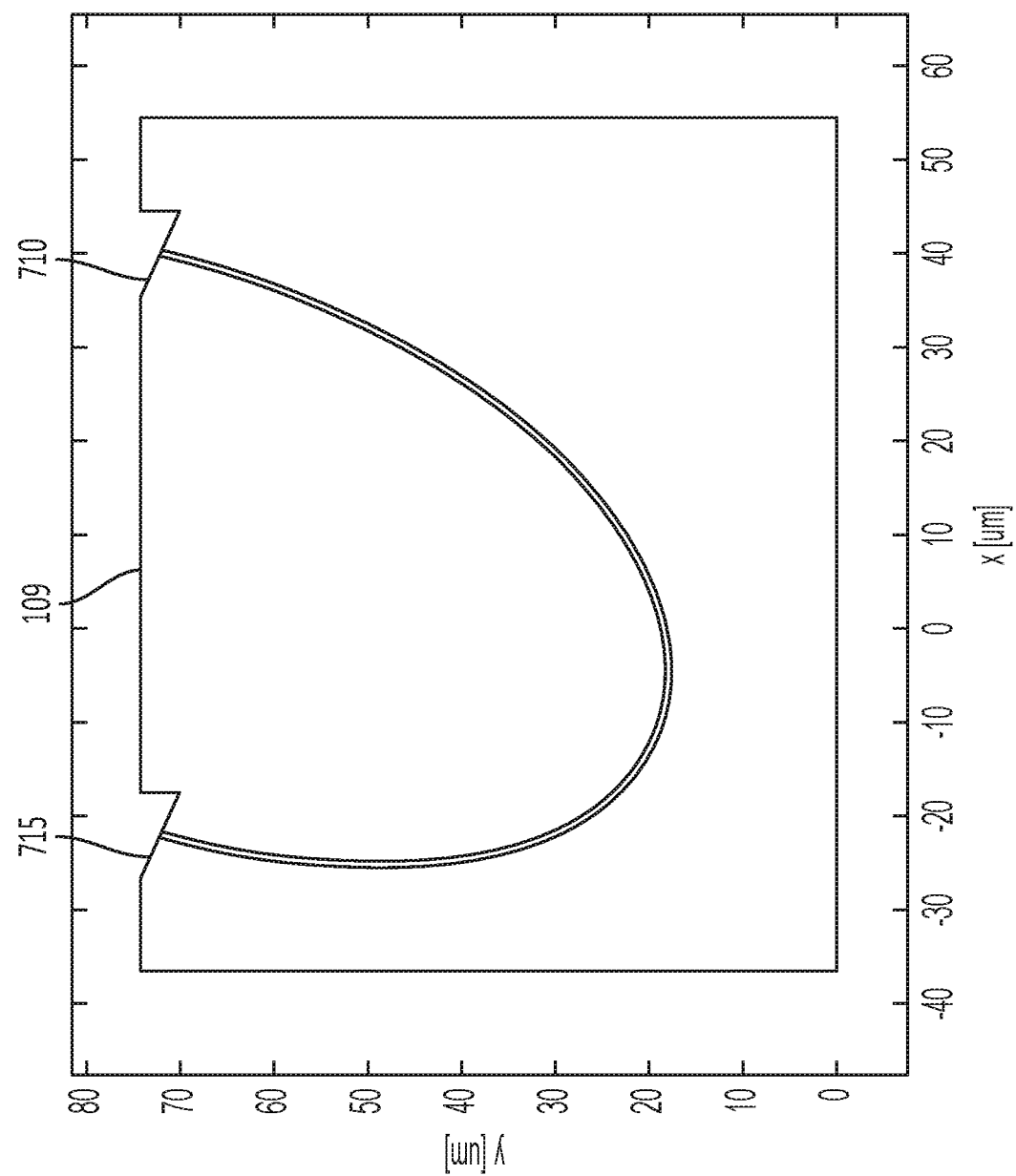
FIG. 9A is a plan view of a curved waveguide, according to an embodiment of the invention.
Figure 9B:
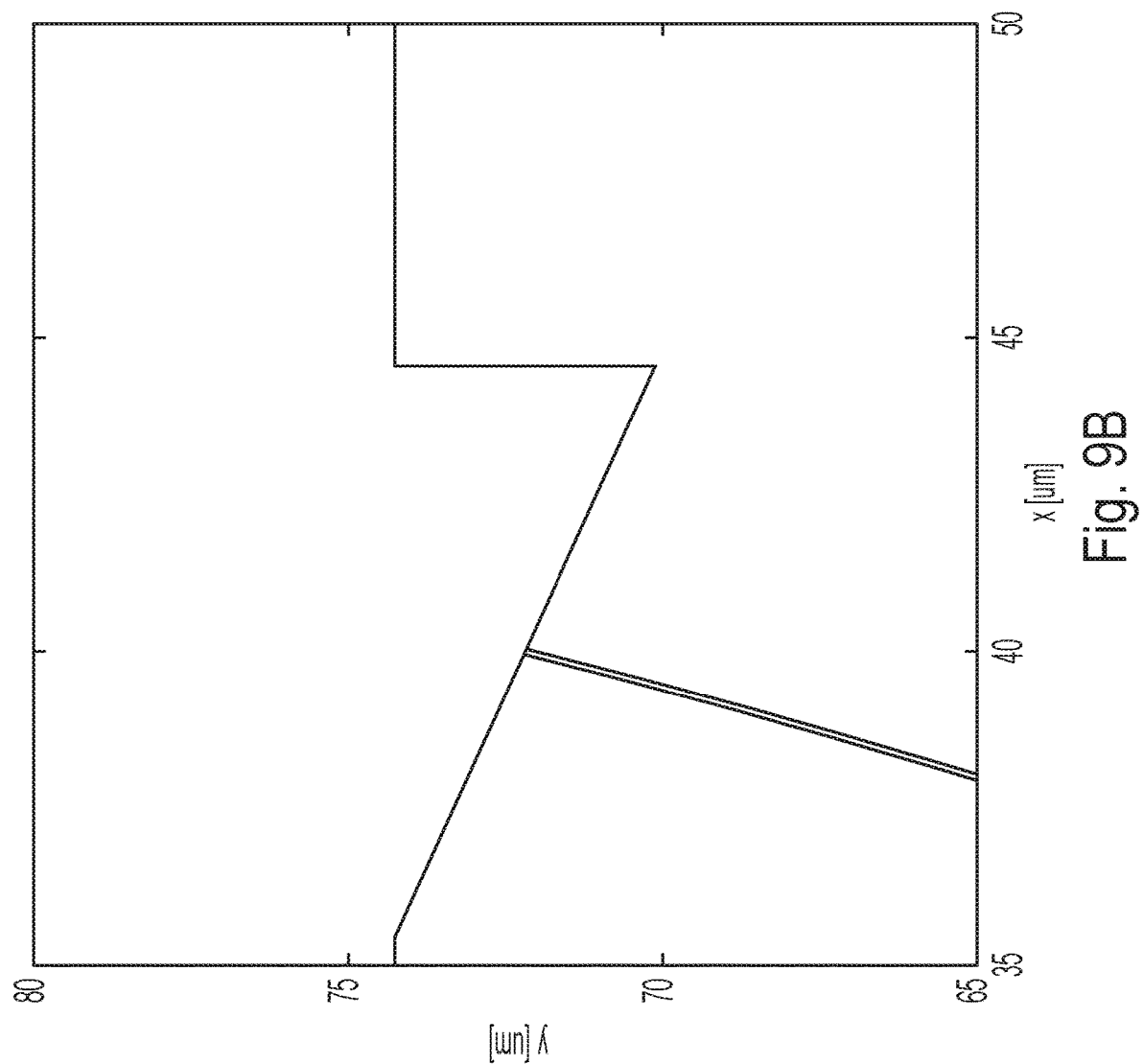
FIG. 9B is an enlarged view of a portion of FIG. 9A.

FIGS. 9A and 9B show an embodiment in which each of the angles of the facet and the waveguide at the second facet 715, instead of being the mirror image of the corresponding angle at the first facet 710, is the same as the corresponding angle at the first facet 710. In the embodiment of FIGS. 9A and 9B the angles of the facets 710, 715 and of the waveguide at the facets 710, 715, are chosen such that the free space beams are perpendicular to the first edge 109. The waveguide extending from the first facet to the second facet is an adiabatic curve, e.g., a Bezier spline. As used herein, a "Bezier spline" is a curve (i) consisting of one or more second order Bezier segments, where each second order Bezier segment is a second order Bezier curve, and (ii) within which the direction and curvature is continuous at the transition between any two adjoining segments. In some embodiments, the Bezier spline includes relatively few (e.g., between 1 and 10) Bezier segments.

Waveguides fabricated using photolithography or other fabrication techniques employed to fabricate photonic integrated circuits may have walls with small-scale (e.g., nm-scale) roughness. This roughness may result in each wall of the waveguide having a local curvature, on a small scale, that is relatively large and fluctuates significantly along the length of the waveguide. This local roughness, however, may have relatively little effect on the propagation of light in the waveguide, and on the coupling between fundamental modes and higher order modes. Accordingly, the curvature of a waveguide (as distinct from the local curvature of a wall of the waveguide) is defined herein as the curvature of that would be measured if the small-scale roughness of the waveguide is disregarded. The curvature of a waveguide may be measured, for example, with an optical microscope, which may be insensitive to features (such as waveguide wall roughness) that are significantly smaller than the wavelength of visible light.

As used herein, a "photonic chip" is a semiconductor chip that includes at least one optical waveguide, and that may include various passive or active optical devices, such as lasers, modulators, or optical splitters or combiners. As used herein, "a portion of" something means "at least some of" the thing, and as such may mean less than all of, or all of, the thing. As such, "a portion of" a thing includes the entire thing as a special case, i.e., the entire thing is an example of a portion of the thing. As used herein, when a second quantity is "within Y" of a first quantity X, it means that the second quantity is at least X−Y and the second quantity is at most X+Y. As used herein, when a second number is "within Y %" of a first number, it means that the second number is at least (1−Y/100) times the first number and the second number is at most (1+Y/100) times the first number. As used herein, the word "or" is inclusive, so that, for example, "A or B" means any one of (i) A, (ii) B, and (iii) A and B.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Some features, and combinations of features, of embodiments of the invention are described in the following 23 clauses, each such clause being presented as a numbered paragraph, with numbers ranging from 1 to 23:

1. A photonic chip, comprising:
   a waveguide; and
   an optically active device comprising a portion of the waveguide,
      the waveguide having:
         a first end at a first edge of the photonic chip; and
         a second end, and
         the waveguide having, everywhere between the first end and the second end, a rate of change of curvature having a magnitude not exceeding 2,000/mm$^2$.
2. The photonic chip of clause 1, wherein the area of a rectangle containing the waveguide is less than 1000 square microns.
3. The photonic chip of clause 1 or clause 2, wherein the length of a rectangle containing the waveguide is less than 200 microns.
4. The photonic chip of any one of the preceding clauses, wherein the width of a rectangle containing the waveguide is less than 80 microns.
5. The photonic chip of any one of the preceding clauses, wherein the waveguide includes a first tapered portion, having a wide end nearer the first end, and a narrow end nearer the second end.
6. The photonic chip of clause 5, wherein the wide end is within 10 microns of the first end.
7. The photonic chip of clause 5 or clause 6, wherein the length of the first tapered portion is within 30% of one third of the length of the waveguide.
8. The photonic chip of any one of clauses 5 to 7, wherein the waveguide has a first width at the wide end and a second width at the narrow end, and the first tapered portion has a length of at least 8 times the difference between the first width and the second width.
9. The photonic chip of any one of the preceding clauses, wherein the curvature of the waveguide at the first end is less than 0.1/mm.
10. The photonic chip of any one of the preceding clauses, wherein the curvature of the waveguide at the second end is less than 0.1/mm.
11. The photonic chip of any one of the preceding clauses, wherein the curvature at a point in the middle 80% of the waveguide is less than 0.1/mm.
12. The photonic chip of any one of the preceding clauses, wherein the waveguide is, at every point along the waveguide, within 3 microns of an adiabatic curve.
13. The photonic chip of any one of the preceding clauses, wherein the greatest value of the magnitude of the rate of change of curvature of the waveguide is within 40% of the average value of the magnitude of the rate of change of curvature of the waveguide.
14. The photonic chip of any one of the preceding clauses, wherein the waveguide is, at every point along the waveguide, within 3 microns of a Bezier spline.
15. The photonic chip of any one of the preceding clauses, wherein the waveguide has, at a first point along its length, an asymmetric profile.
16. The photonic chip of clause 15, wherein at the first point, the waveguide has a first sidewall having a first height and a second sidewall having a second height, the second height being at least 30% greater than the first height.
17. The photonic chip of any one of the preceding clauses, wherein:
    the second end is at the first edge of the photonic chip;
    the waveguide has a first facet at the first end, and a second facet at the second end;
    the first facet is:
       oblique to the waveguide at the first end, and
       oblique to the first edge,
    a fundamental mode of the waveguide at the first end corresponds to a first free space beam outside the first facet, the first free space beam having a first centerline; and a fundamental mode of the waveguide at the second end corresponds to a second free space beam outside the second facet, the second free space beam having a second centerline,
    the first centerline is within 10 degrees of being parallel to the second centerline.
18. The photonic chip of clause 17, wherein the second centerline is within 10 degrees of a direction that is the mirror image of the direction of the first centerline.
19. The photonic chip of clause 17 or clause 18, wherein:
    the first centerline is within 10 degrees of being perpendicular to the first edge, and
    the second centerline is within 10 degrees of being perpendicular to the first edge.
20. The photonic chip of any one of the preceding clauses, wherein the total direction change within the waveguide is less than 175 degrees.
21. The photonic chip of any one of the preceding clauses, wherein the total direction change within the waveguide is less than 155 degrees.
22. A photonic chip, comprising:
    a waveguide; and
    an optically active device comprising a portion of the waveguide,
       the waveguide having:
          a first end at a first edge of the photonic chip; and
          a second end, and
          wherein the total direction change within the waveguide is less than 175 degrees.
23. The photonic chip of clause 22, wherein the total direction change within the waveguide is less than 175 degrees.

Although exemplary embodiments of an optoelectronic device and array thereof have been specifically described and illustrated herein, many modifications and variations will be apparent to those skilled in the art. Accordingly, it is to be understood that an optoelectronic device and array thereof constructed according to principles of this disclosure may be embodied other than as specifically described herein. The invention is also defined in the following claims, and equivalents thereof.

What is claimed is:
1. A photonic chip, comprising:
   a waveguide; and
   an electro-absorption modulator comprising the waveguide,
      the waveguide having:
         a first end at a first edge of the photonic chip; and
         a second end at the first edge of the photonic chip,
      the waveguide having, at a point between the first end and the second end, a curvature having a magnitude greater than 5/mm, and the waveguide having, everywhere between the first end and the second end, a rate of change of curvature having a magnitude not exceeding 2,000/mm$^2$, wherein:

the waveguide has a first facet at the first end, and a second facet at the second end;

the first facet is:
- oblique to the waveguide at the first end, and
- oblique to the first edge, a fundamental mode of the waveguide at the first end corresponds to a first free space beam outside the first facet, the first free space beam having a first centerline;

a fundamental mode of the waveguide at the second end corresponds to a second free space beam outside the second facet, the second free space beam having a second centerline; and the first centerline is within 10 degrees of being parallel to the second centerline.

2. The photonic chip of claim 1, wherein the area of a rectangle containing the waveguide is less than 1000 square microns.

3. The photonic chip of claim 1, wherein the length of a rectangle containing the waveguide is less than 200 microns.

4. The photonic chip of claim 1, wherein the width of a rectangle containing the waveguide is less than 80 microns.

5. The photonic chip of claim 1, wherein the waveguide includes a first tapered portion, having a wide end nearer the first end, and a narrow end nearer the second end.

6. The photonic chip of claim 5, wherein the wide end is within 10 microns of the first end.

7. The photonic chip of claim 6, wherein the length of the first tapered portion is within 30% of one third of the length of the waveguide.

8. The photonic chip of claim 7, wherein the waveguide has a first width at the wide end and a second width at the narrow end, and the first tapered portion has a length of at least 8 times the difference between the first width and the second width.

9. The photonic chip of claim 8, wherein the curvature of the waveguide at the first end is less than 0.1/mm.

10. The photonic chip of claim 9, wherein the curvature of the waveguide at the second end is less than 0.1/mm.

11. The photonic chip of claim 10, wherein the curvature at a point in the middle 80% of the waveguide is less than 0.1/mm.

12. The photonic chip of claim 1, wherein the waveguide is, at every point along the waveguide, within 3 microns of an adiabatic curve.

13. The photonic chip of claim 1, wherein the greatest value of the magnitude of the rate of change of curvature of the waveguide is within 40% of the average value of the magnitude of the rate of change of curvature of the waveguide.

14. The photonic chip of claim 1, wherein the waveguide is, at every point along the waveguide, within 3 microns of a Bezier spline.

15. The photonic chip of claim 1, wherein the waveguide has, at a first point along its length, an asymmetric profile.

16. The photonic chip of claim 1, wherein the second centerline is within 10 degrees of a direction that is the mirror image of the direction of the first centerline.

17. The photonic chip of claim 16, wherein:
the first centerline is within 10 degrees of being perpendicular to the first edge, and
the second centerline is within 10 degrees of being perpendicular to the first edge.

18. The photonic chip of claim 1, wherein the total direction change within the waveguide is less than 175 degrees.

19. The photonic chip of claim 18, wherein the total direction change within the waveguide is less than 155 degrees.

20. A photonic chip, comprising:
a waveguide; and
an electro-absorption modulator comprising the waveguide,
the waveguide having:
 a first end at a first edge of the photonic chip; and
 a second end at the first edge of the photonic chip,
the waveguide having, at a point between the first end and the second end, a curvature having a magnitude greater than 5/mm, and
the waveguide having, everywhere between the first end and the second end, a rate of change of curvature having a magnitude not exceeding 2,000/mm$^2$,
wherein the waveguide has, at a first point along its length, an asymmetric profile, and
wherein at the first point, the waveguide has a first sidewall having a first height and a second sidewall having a second height, the second height being at least 30% greater than the first height.

* * * * *